United States Patent
Pajovic et al.

(10) Patent No.: US 10,324,135 B2
(45) Date of Patent: Jun. 18, 2019

(54) METHODS AND SYSTEMS FOR DATA-DRIVEN BATTERY STATE OF CHARGE (SOC) ESTIMATION

(71) Applicant: Mitsubishi Electric Research Laboratories, Inc., Cambridge, MA (US)

(72) Inventors: Milutin Pajovic, Cambridge, MA (US); Gozde Ozcan, Cambridge, MA (US); Zafer Sahinoglu, Cambridge, MA (US); Yebin Wang, Acton, MA (US); Philip Orlik, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 329 days.

(21) Appl. No.: 15/174,195

(22) Filed: Jun. 6, 2016

(65) Prior Publication Data
US 2017/0350944 A1 Dec. 7, 2017

(51) Int. Cl.
*G01R 31/36* (2019.01)
*G01R 31/3842* (2019.01)
*G01R 31/367* (2019.01)

(52) U.S. Cl.
CPC ........ *G01R 31/3648* (2013.01); *G01R 31/367* (2019.01); *G01R 31/3842* (2019.01)

(58) Field of Classification Search
None
See application file for complete search history.

(56) References Cited

U.S. PATENT DOCUMENTS

| 9,465,078 | B2 * | 10/2016 | Betzner | ............ G01R 31/3651 |
| 2017/0131363 | A1 * | 5/2017 | Scott | .................. G01R 31/3679 |

FOREIGN PATENT DOCUMENTS

| CN | 104505894 A | 4/2015 |
| EP | 2980596 A1 | 2/2016 |

OTHER PUBLICATIONS

Christopher Mollen et al. "One-Bit ADCS in Wideband Massive MIMO Systems With OFDM Transmission," Acoustics, Speech and Signal Processing (ICASSP), 2016 IEEE International Conference on. Mar. 20-25, 2016.

(Continued)

*Primary Examiner* — Aditya S Bhat
(74) *Attorney, Agent, or Firm* — Gennadiy Vinokur; James McAleenan; Hironori Tsukamoto

(57) ABSTRACT

Methods and systems for estimating a state of charge (SoC) of a battery are disclosed. A method determines a first joint Gaussian distribution of values of the SoC given a set of historical measured physical quantities of the state of the battery and a corresponding set of historical values of the SoC of the battery. The method determines a second joint Gaussian distribution of SoC using the set of historical measured physical quantities and the corresponding set of historical values of the SoC, current measurement physical quantities of the battery and the first joint Gaussian distribution. Finally, the method determines a mean and a variance of the current value of the SoC of the battery from the second joint Gaussian distribution. The mean is an estimate of the current SoC of the battery, and the variance is a confidence of the estimate.

20 Claims, 18 Drawing Sheets

(56) References Cited

OTHER PUBLICATIONS

Joaquin Qui nonero-Candela et al. "A Unifying View of Sparse Approximate Gaussian Process Regression." Journal of Machine Learning Research 6 (2005) 1939-1959. Submitted Oct. 2005; Published Dec. 2005.

Liu, Datong et al. "Prognostics for state of health estimation of lithium-ion batteries based on combination Gaussian Process functional regression," Microelectronics and Reliability, Elsevier Science Ltd. GB. vol. 53, No. 6, Apr. 17, 2013. pp 832-839. XP028550112.

Piller et al. "Methods for state of charge determination and their applications," Journal of power sources, Elsevier, SA, CH. vol. 96, No. 1, Jun. 1, 2001, pp. 113-120. XPO27380215.

He et al. "State of Charge Estimation for Li-ion Batteries using Nueral Network Modeling and Inscented Kalman Filter-based Error Cancellation." International Journal of Electrical Power & Energy Systems, vol. 62, Jun. 18, 2014. pp. 783-791. XP028860927.

Li et al. "A new prognostics method for state of health estimation of lithium-ion batteries based on a mixture of Gaussian process models and particle filter," Microelectronics and Reliability, vol. 55, No. 7, Apr. 25, 2015. pp. 1035-1045. XP029187828.

Ozcan et al. "Online battery state of charge estimation based on sparse gaussian process regression," 2016 IEEE Power and Energy Society General Meeting, Jul. 17, 2016, pp. 1-5. XP033000094.

* cited by examiner

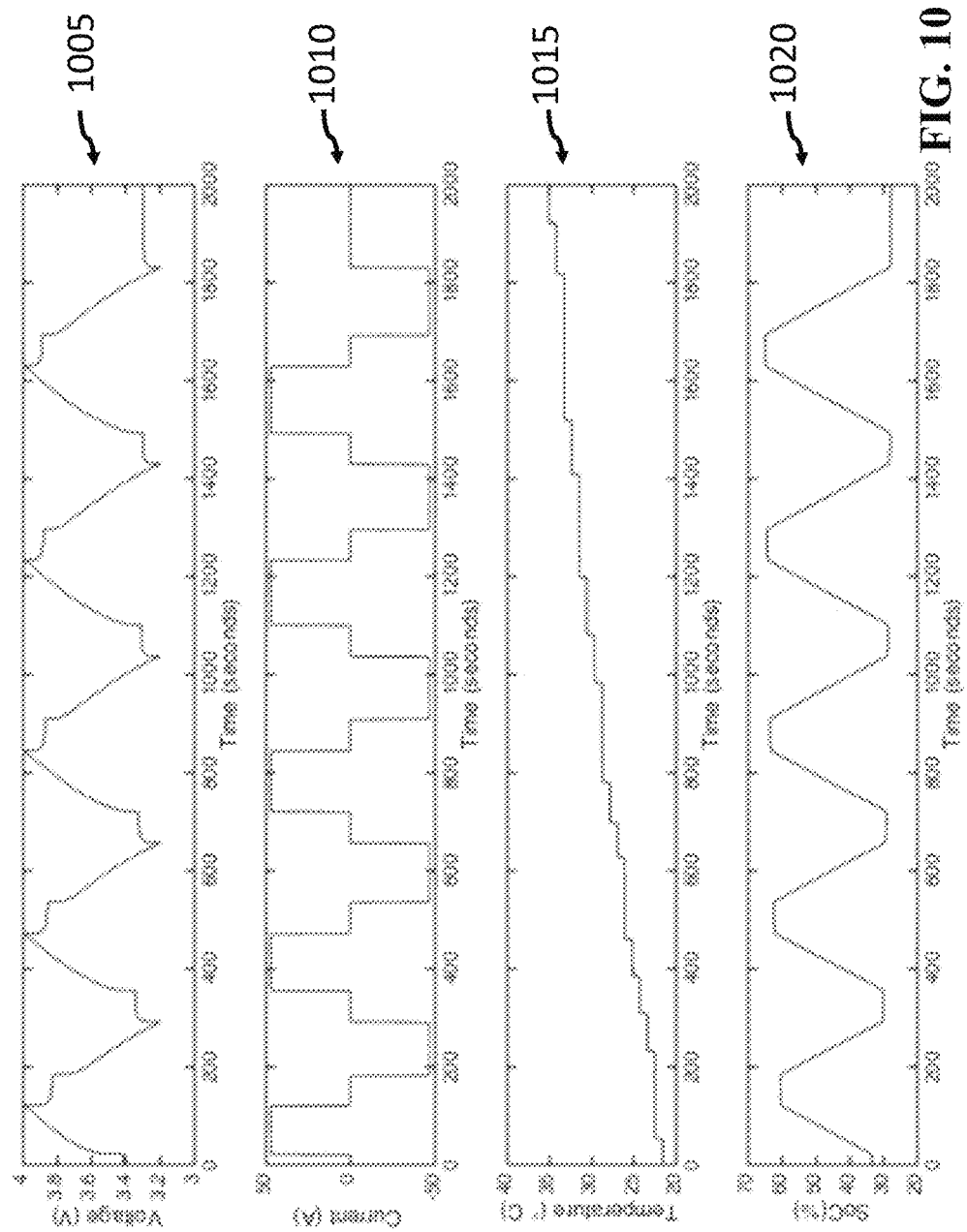

METHODS AND SYSTEMS FOR DATA-DRIVEN BATTERY STATE OF CHARGE (SOC) ESTIMATION

FIELD

The present disclosure relates to methods and systems for a data-driven battery state of charge (SoC) estimation. More particularly, the present disclosure relates to estimating the state of charge of a rechargeable battery.

BACKGROUND

State of charge (SoC) is defined as the percentage of available charge remaining in the battery. The SoC gives an indication when the battery should be recharged, which can enable battery management systems to improve the battery life by protecting the battery from over-discharge and over-charge events. Therefore, there is of great importance to accurately measure the SoC for proper battery management.

Rechargeable batteries store energy through a reversible chemical reaction. Conventionally, rechargeable batteries provide a lower cost of use and result in supporting Green initiatives toward impacting the environmental than non-rechargeable batteries. For example, Lithium-ion (Li-ion) rechargable batteries have been widely deployed as a major energy storage component in numerous applications including consumer electronics, residential rooftop solar photovoltaic systems, electric vehicles, smart grid systems and etc. At least some main advantages of Li-ion batteries over other types of batteries with different chemistries are low self-discharge rate, high cell voltage, high energy density, lightweight, long lifetime, and low maintenance.

However, a Li-ion battery and other types of batteries are a chemical energy storage source, and this chemical energy cannot be directly accessed. This issue makes the estimation of the SoC of a battery difficult. Accurate estimation of the SoC remains very complex and is difficult to implement, because battery models cannot capture physics-based non-linear dynamics and associated parametric uncertainties. Many examples of poor accuracy and reliability of the estimation of the SoC of batteries are found in practice.

Conventional SoC battery estimation techniques are usually classified into model-based and data-driven based methods. Model-based methods exploit models capturing battery's chemical and physical processes. Data-driven methods use training data to map the measurements of physical quantities of the battery to corresponding values of SoC. However, the processes in the battery are very complex, because a battery is an interconnected system of many subsystems representing physical and chemical processes happening in the battery. The output of each subsystem additively contributes to the overall SoC. Such a complexity allows using only overly simplified models or simplified mapping preventing an accurate estimation of the SoC of the battery.

Therefore, there is a need for improved methods and systems for estimating the SoC of a battery.

SUMMARY

Some embodiments are based on recognition that conditions in the environment where the battery operates, such as outer temperature, humidity, air motions vary in an unpredictable manner and cause the outputs of the subsystems of the battery to vary in an unpredictable, e.g., random, way. Thus, the subsystem outputs can be modeled as random variables and consequently, the resulting SoC is also random.

To that end, some embodiments are based on realization that by invoking the Central Limit Theorem (CLT), the resulting SoC given the input measurements can be modeled as a Gaussian distribution. Similarly, the SoC values corresponding to different inputs, given those inputs, are jointly Gaussian distributed according to the CLT.

Accordingly, some embodiments determine, e.g., during a training phase given the inputs and corresponding outputs in the training data, parameters of a first joint Gaussian distribution of the outputs given the inputs. During an estimation phase, some embodiments determine, using parameters of the first joint Gaussian distribution, a second joint Gaussian distribution of the values of SoC and a current value of the SoC of the battery given the set of measurements and the current measurement. In such a manner, the SoC of the battery can be determined probabilistically, e.g., a mean and a variance of the current value of the SoC of the battery can be determined from the second joint Gaussian distribution.

According to another method of the disclosed subject matter, a method for estimating a state of charge (SoC) of a battery while the battery is in communication with at least one processor connected to a memory. The method including determining a first joint Gaussian distribution of values of the SoC of the battery from a set of historical measured physical quantities of the state of the battery and a corresponding set of historical values of the SoC of the battery. Further, determining a second joint Gaussian distribution of values of the SoC of the battery using the set of historical measured physical quantities of the state of the battery and the corresponding set of historical values of the SoC of the battery, current measured physical quantities of the battery, and the determined first joint Gaussian distribution. Finally, determining a mean and a variance of a current SoC of the battery from the second joint Gaussian distribution, wherein the mean is an estimate of the current SoC of the battery, and the variance is a confidence of the estimate, wherein steps of the method are determined using the at least one processor.

According to another method of the disclosed subject matter, a method for estimating a state of charge (SoC) of a rechargeable battery while the battery is in communication with at least one processor connected to a memory. The method including selecting a first joint Gaussian distribution determined based upon, a set of historical measured physical quantities of the state of the battery and a corresponding set of historical values of the SoC of the battery. Further, determining a second joint Gaussian distribution of values of the SoC of the battery using the set of historical measured physical quantities of the state of the battery, the corresponding set of historical values of the SoC of the battery, the current measured physical quantities of the battery, and the determined first joint Gaussian distribution. Finally, determining, a mean and a variance of a current SoC of the battery from the second joint Gaussian distribution, wherein the mean is an estimate of the current SoC of the battery, and the variance is a confidence of the estimate, wherein steps of the method are determined using the at least one processor.

According to a system of the disclosed subject matter, a sensor system for estimating a state of charge (SoC) of a battery. The system including a memory having stored therein information about data related to estimating the SoC of the battery. A processor operatively connected to the memory and outputs of sensors measuring physical quantities of the battery. The processor is configured to select from the memory a first joint Gaussian distribution of values of the SoC of the battery given a set of historical measured physical quantities of a state of the battery and the corresponding set of historical values of the SoC of the battery. The processor is further configured to determine a second joint Gaussian distribution of SoC of the battery using the set of historical measured physical quantities of the state of the battery and the corresponding set of historical values of the SoC of the battery, the current measured physical quantities of the battery, and the first joint Gaussian distribution. The processor is also configured to determine a mean and a variance of the current value of the SoC of the battery from the second joint Gaussian distribution, wherein the mean is an estimate of the current SoC of the battery, and the variance is a confidence of the estimate.

Further features and advantages will become more readily apparent from the following detailed description when taken in conjunction with the accompanying drawings.

DESCRIPTION OF THE DRAWINGS

The present disclosure is further described in the detailed description which follows, in reference to the noted plurality of drawings by way of non-limiting examples of exemplary embodiments of the present disclosure, in which like reference numerals represent similar parts throughout the several views of the drawings. The drawings shown are not necessarily to scale, with emphasis instead generally being placed upon illustrating the principles of the presently disclosed embodiments.

FIG. 10 illustrates graphs of an experimental data set including voltage, current, temperature and SoC of the battery vs. time during five charging-discharging cycles, according to embodiments of the disclosure;

FIG. 11A corresponding to the squared exponential (SE) covariance function; FIG. 11B corresponds to the Matèrn covariance function; FIG. 11C corresponds to the rational quadratic (RQ) covariance function.

FIGS. 12A-12C illustrate graphs evaluating the performance of SoC estimation method based on the combination of the GPR and Kalman filter, wherein FIGS. 12A-12C show plots of the actual SoC, the estimated SoC values and 95% confidence interval for different covariance functions: FIG. 12A corresponds to the squared exponential (SE) covariance function; FIG. 12B corresponds to the Matèrn covariance function; FIG. 12C corresponds to rational quadratic (RQ) covariance function; and FIG. 12D corresponds to sum of Matèrn and RQ covariance functions, according to embodiments of the disclosure.

Figure 1A:
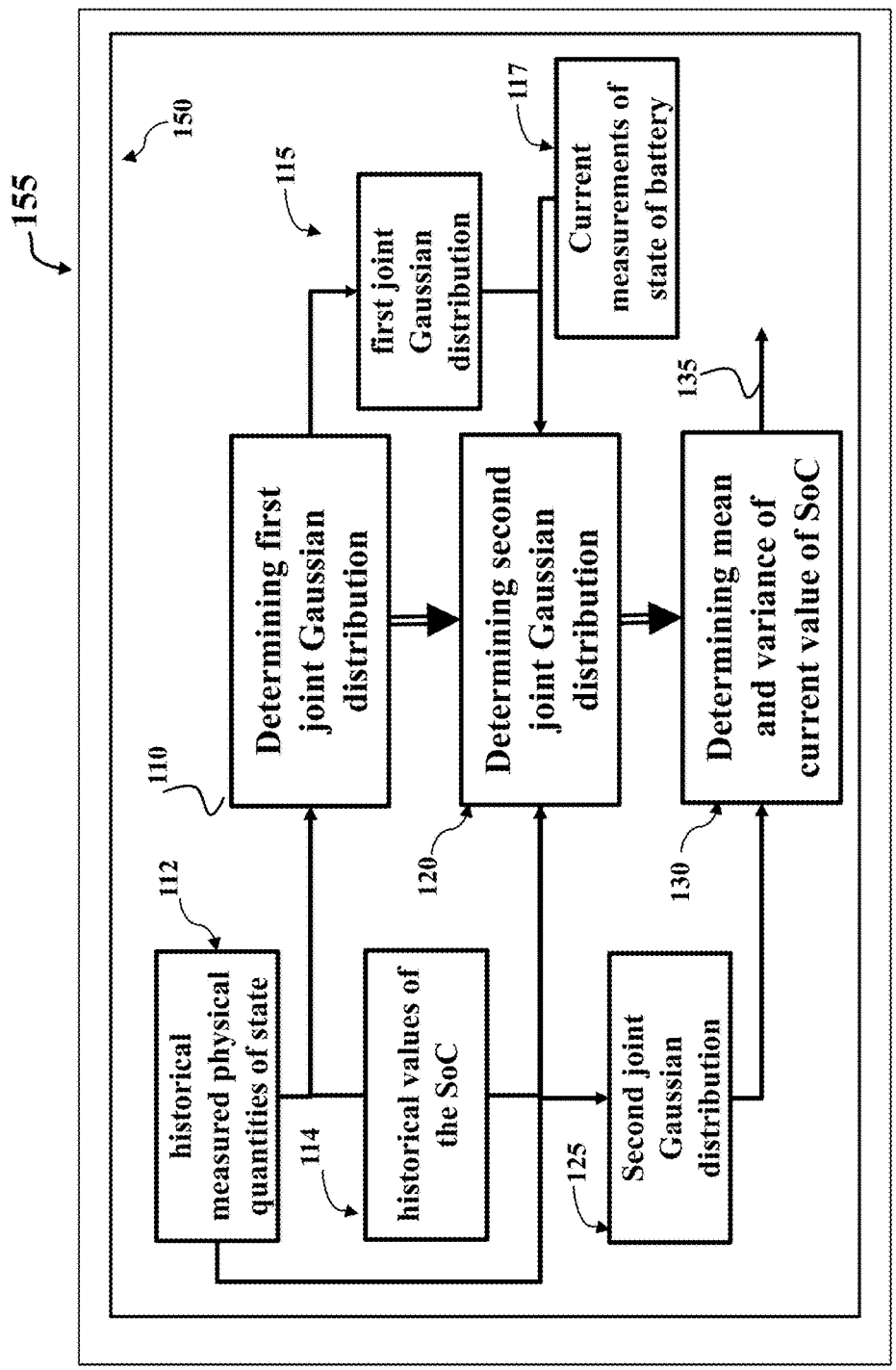
FIG. 1A is a block diagram of a method for estimating a state of charge (SoC) of a battery while the battery according to some embodiments.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

According to some embodiments of the disclosure is to provide methods and systems for estimating a state of charge (SoC) of a battery. A state of charge (SoC) may be understood as the percentage of remaining charge in a battery relative to the full battery capacity. "State of charge values" can refer to the specific percentages. For example, SoC gives an indication when the battery should be recharged and can be at least one key parameter for assessing a battery's state. Further, SoC can assist battery management systems to improve the battery life by protecting the battery from over-discharge and over-charge events.

According to some other embodiments of the disclosure is to provide a method that quantifies uncertainty of the estimate, which can be important for evaluating the reliability of SoC estimates. In particular, a battery can be viewed as an interconnected system of many subsystems, where each subsystem represents one of many physical and chemical processes happening in the battery, and where the output of each subsystem additively contributes to the overall battery's SoC. Further the term battery may include a device consisting of one or more electrochemical cells that convert stored chemical energy into electrical energy. The definition of battery can include a rechargeable battery.

The conditions in the environment where the battery operates, such as outer temperature, humidity, air motions, which vary in an unpredictable manner and which cannot be measured or controlled, cause the outputs of the subsystems to vary in an unpredictable way. Thus, the subsystem outputs may be modeled as random variables and consequently, the resulting SoC is also random. By invoking a Central Limit Theorem (CLT), some embodiments are based on realization that the SoC of the battery can be determined probabilistically, because the SoC given the input measurements can be modeled as a Gaussian distribution.

Additionally, one embodiment is based on recognition that because the SoC is, by definition, a value between 0 and 1 (i.e., 0% and 100%), the mean and variance of the Gaussian distribution above are such that the probability that the SoC is outside this range is vanishingly small. Alternatively, the Gaussian distribution can be bounded between 0 and 1, in which case the Gaussian distribution becomes a truncated Gaussian distribution.

According to principles of the Gaussian distribution the SoC values corresponding to similar inputs are not very different from each other. In other words, the SoC values corresponding to similar inputs, should also be similar. Consequently, one embodiment embeds a similarity measure into a definition of the way the covariance matrix of the joint Gaussian distribution. For example, the embodiment determines the covariance between two outputs based on a measure of similarity between the corresponding inputs. In various implementation of this embodiment, the measure of similarity can be a Euclidean distance between the inputs, an inner product between the inputs or some more complicated function with parameters.

FIG. 1A shows a block diagram of a method for estimating a state of charge (SoC) of a battery while in communication with the battery according to some embodiments. The method can be implemented using a processor 155 operatively connected to a memory (not shown) having stored therein information about data related to estimating the SoC of the battery and operatively connected to outputs of sensors (not shown) measuring physical quantities of the battery. It is contemplated processor 155 may be used for calculating the state of charge (SoC) of a battery, among other things, and may be integrated into a device in which the battery is used, or may be an external system. Processor 155 may alternatively be a component of a separate device, and may determine other aspects when the battery is inserted into this separate device and may be an electrical circuit. Information about the SoC of the battery may be transmitted wirelessly or via wires from a separate device to the processor and from the processor to a display or the separate device. Further, processor 155 can be more than one processor, such that each processor may have at least one memory. It is contemplated that more than one processor may be in communication with another processor.

Still referring to FIG. 1A, the method may be implemented using a battery management application 150 running on the processor 155, and can implement and execute various battery management methods. The method can determine 110 a first joint Gaussian distribution 115 of values of the SoC of the battery from a set of historical measured physical quantities 112 of the state of the battery and a corresponding set of historical values 114 of the SoC of the battery. The method determines 120 a second joint Gaussian distribution 125 of values of the SoC of the battery using the set of historical measured physical quantities 112 of the state of the battery and the corresponding set of historical values 114 of the SoC of the battery, current measured physical quantities 117 of the battery, and the determined first joint Gaussian distribution 115.

The second joint Gaussian distribution 125 of values of the SoC of the battery is the probabilistic distribution of the values of the SoC given current measurements 117. In such a manner, the SoC of the battery is determined probabilistically. For example, the method determines 130 a mean and a variance 135 of the current value of the SoC of the battery from the second joint Gaussian distribution is the probabilistic measurements of the SoC. Specifically, the mean is an estimate of the current SoC of the battery, and the variance is a confidence of the estimate.

Figure 1B:
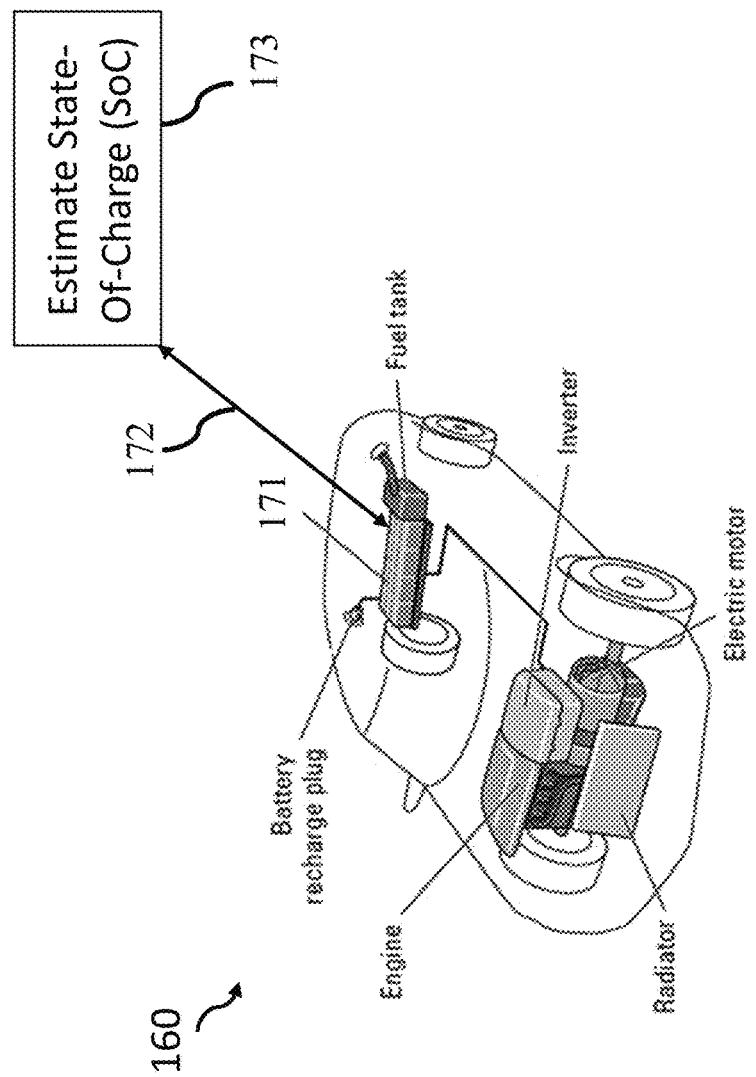
FIG. 1B illustrates an application of one embodiment for determining the SoC for a battery powering an electric vehicle.

FIG. 1B shows an exemplar determination of the SoC of the battery 161 installed at an electric vehicle 160 according to some embodiments of the disclosure. For example, some embodiments enable a driver of the vehicle 160 to manage the battery system to ensure enough power is available. In general, a separate device 173, e.g., including the processor and memory, is connected to the battery 171 and/or the sensors of the battery 171 via connectors 172 can perform the necessary measurements and estimates the SoC. It is contemplated the separate device 173 can include a battery management application, among other things.

Figure 1C:
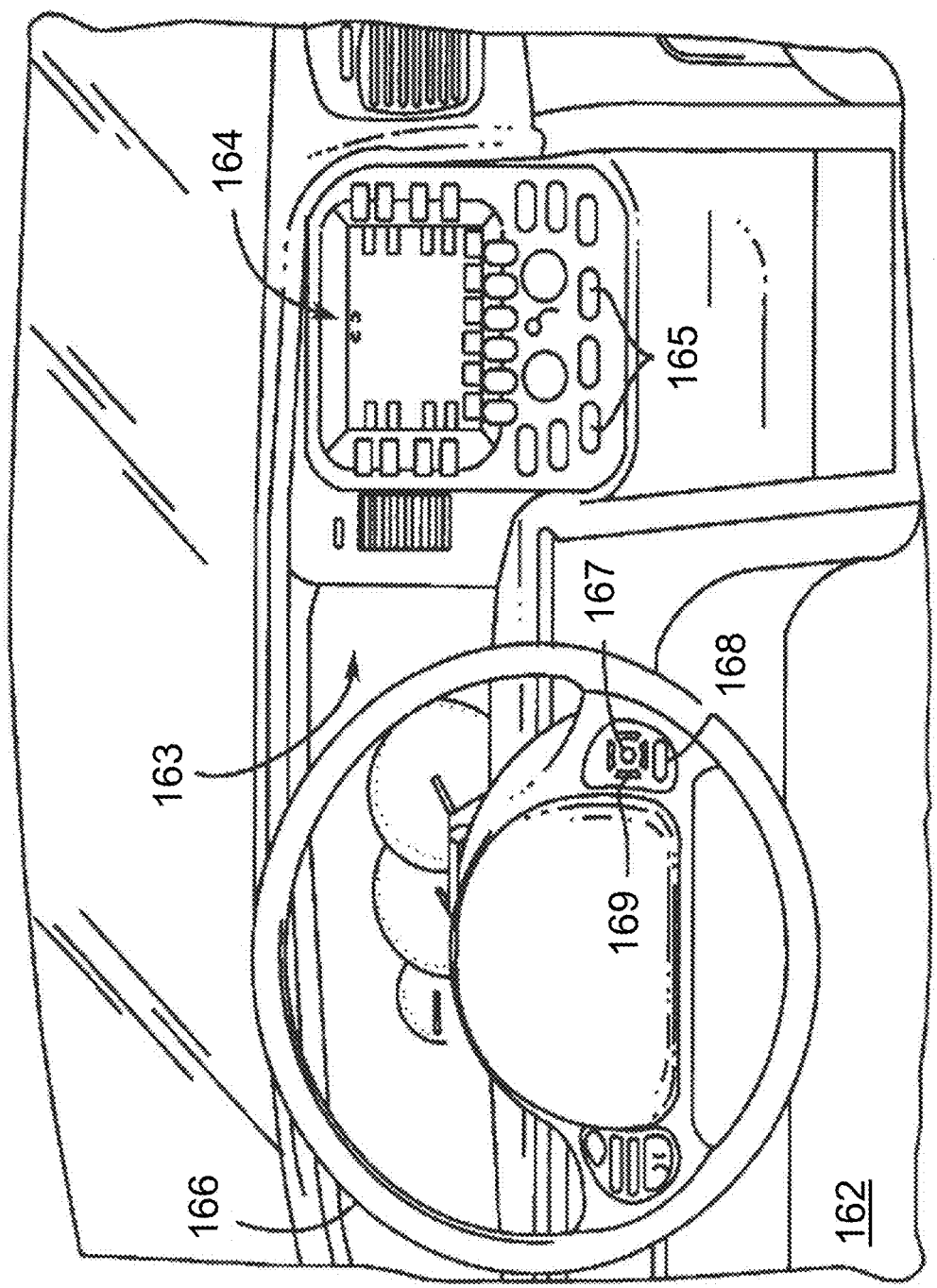
FIG. 1C is a schematic of an exemplar instrumental panel of the vehicle for displaying the estimated SoC of the embodiment of FIG. 1B.

FIG. 1C shows an exemplar instrumental panel 162 of the vehicle 160. The instrumental panel 162 can include one or several displays 163 and 164 for displaying the results of the SoC estimation to the driver of the vehicle. The SoC estimation can be shown on the displays 163, 164 automatically or when the critical level of the SoC is reached. Additionally, or alternatively, the SoC can be displayed on demand, e.g., via controls 165 and/or controls 167, 168 and/or 169 located on a steering wheel 166. It is contemplated the display may be a wireless device separate from the instrumental panel 162.

Figure 2A:
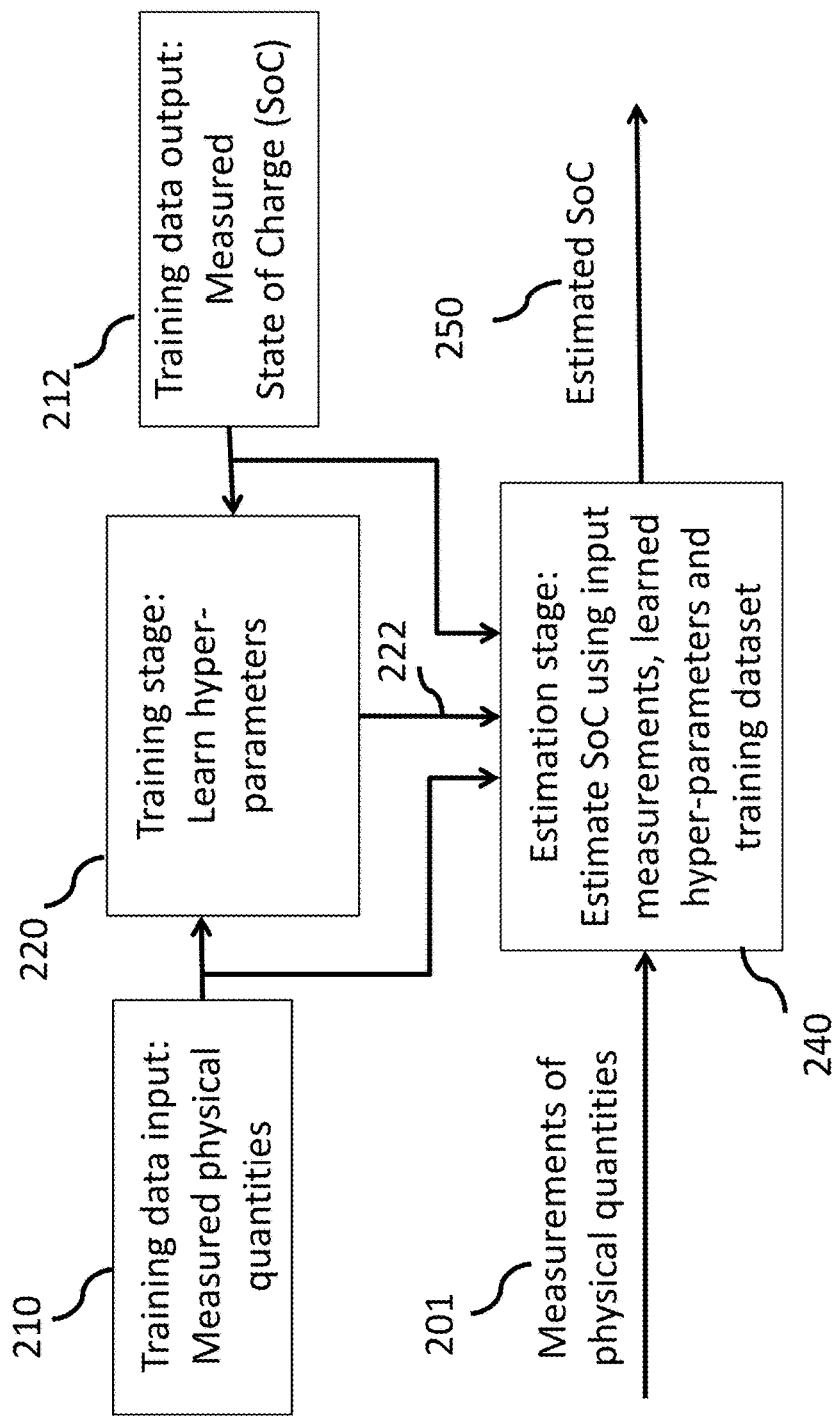
FIG. 2A and FIG. 2B are block diagrams estimating state of charge (SoC) of a battery that includes the training stage and the estimation stage, according to embodiments of the disclosure.

FIG. 2A shows a block diagram of a multi-stage method for determining SoC of the battery according to one embodiment of the disclosure. The embodiment determines the SoC in two stages, i.e., a training stage 220 and an estimation stage 240. It is contemplated when estimating a state of charge (SoC) of a battery the battery is in communication with at least one processor having a memory.

The method of FIG. 2A uses measurements of physical quantities 201, which are obtained from measurement devices such as sensing devices coupled to an electronic circuit structure, attached to a battery of interest. The measured physical quantities 201 can include voltage, current and temperature of the battery of interest. Contemplated is the measured physical quantities 201 that may also include ambient temperature, volume of the battery, and gas leak measurement from the battery. Furthermore, in another embodiment, that the measured physical quantities may include current measurements in the current as well as in previous time instants. Note, in this other embodiment, the input at time t can be measurements at time t, t−1, ..., t−T, for example.

Training data is gathered and is used to infer mapping between physical quantities and the battery's SoC. For example, training data input 210 is retrieved from a memory of the processor. In particular, the training data input 210 is obtained offline, usually in a lab, and the measurements are taken by exposing a battery of the same type as the battery of interest, to a wide range of different temperatures, loads, etc. For example, the training data input 210 can be a collection of measurements of different physical quantities such as previous SoC, current, voltage, temperature, volume, etc., or some combination thereof, that is of the same type of battery as the battery of interest. Contemplated is the training data input 210 that may also include ambient temperature and gas leak measurement from the battery and also previous temporal values of the current, voltage and volume. The training data output 212 is the corresponding SoC values of the training data input 210 which was previously determined and saved in the memory of the processor.

Training Stage

Still referring to FIG. 2A, the training stage 220, the processor offline utilizes the training data (training data input 210 and training data output 212), and performs training, in which, optimal hyper-parameters 222 are determined such that a chosen covariance function reasonably models the properties of the training data 210, 212; and wherein the optimized hyper-parameters 222 are stored in memory.

Learning Optimized Hyper-Parameters During Training Stage

At least one method in determining the optimized hyper-parameters 222 in the training stage 220, includes using a Gaussian Process Regression (GPR) framework, which is a probabilistic, nonparametric machine learning method, to accurately estimate the SoC of Li-ion batteries. It is noted the term regression means can be an expression of an output variable of interest in terms of a function or a combination of functions of one or more input parameters.

The GPR framework can be used as a nonparametric machine learning to model the relationship between the voltage, current and temperature and the SoC. GPR is a very useful due the GPR's ability to represent a wide variety of models and to provide accurate SoC estimation and a measure of estimation uncertainty, which will be discussed later. Further, GPR can be trained offline by using voltage, current and temperature measurements of the battery, and then used to infer the SoC values. One of the main advantages of GPR is analytically tractable inference with elegant closed-form expressions. Based upon a review of the technology within this space, this is the first time this method is being used to investigate the use of a GPR learning method to estimate the SoC of Li-ion batteries. For example, GPR is further discussed below:

Gaussian Process Regression (GPR)

Using a training data set, 210, 212 D=(X,y) comprising D-dimensional N input vectors $X=\{x_n\}_{n=1}^N$ 210, where $x_n \in R^D$, and the corresponding outputs $y=\{y_n\}_{n=1}^N$ 212, where $y_n \in R$. In this setting, the input-output relationship is written as $$y_n = f(x_n) + \varepsilon_n, \quad (1)$$

where $f(.)$ is the underlying latent function and $\varepsilon_n$ denotes zero-mean additive Gaussian noise with variance $\sigma_n^2$, i.e., $\varepsilon_n : N(0, \sigma_n^2)$. Assumed is that $\{\varepsilon_n\}_{n=1}^N$ form an independent and identically distributed (i.i.d) sequence. The main objective is to model the underlying function $f(.)$ which maps the inputs, X to their corresponding output values, y. The key assumption in GPR is that any set of function values follow a multivariate Gaussian distribution $$p(f|x_1, x_2, \ldots, x_n) = N(0, K). \quad (2)$$

Above, $f=[f(x_1), f(x_2), \ldots, f(x_n)]^T$ and 0 is a N×1 vector whose elements are all 0. In addition, K is a covariance matrix, whose entries $K_{ij} = k(x_i, x_j)$ are the values of covariance function evaluated for all pairs of training inputs. Covariance functions, also called kernels, play an important role in GPR since they encode assumptions about the smoothness, periodicity, non-stationary and other properties of the latent function that we are trying to model. Such processes can be previously stored as one or more distribution selection procedure on the processor.

At least three covariance functions that can be adopted in this work are briefly described:

Squared Exponential Covariance Function:

A squared exponential (SE) covariance function may be used. For D-dimensional inputs 210, the SE covariance function takes the following form $$k_s(x_i, x_j) = \sigma_0^2 \exp\left[-\frac{1}{2} \sum_{d=1}^D \left(\frac{x_{id} - x_{jd}}{l_d}\right)^2\right], \quad (3)$$

where the use of the subscript s will become clear later. Above, $\sigma_0^2 > 0$ represents the signal variance, which determines the magnitude of the variation of the underlying function from its respective mean, $l_D > 0$ denotes the characteristic length scale for the input dimension D. The characteristic length scales quantify the relative importance of corresponding input variables to the target output. More specifically, a smaller value of the characteristic length scale implies that the corresponding input dimension has more impact on the output, hence the smaller value of the characteristic length scale is more relevant. The covariance function is parameterized by this set of unknown parameters $\Theta = [\sigma_0, l_1, l_2, \ldots, l_D]^T$ called hyperparameters of the GPR. Respectively, the hyperparameters need to be determined from the training data set such that the resulting covariance function reasonably well models the properties of the data.

Matèrn Covariance Function:

A Matèrn covariance function for D-dimensional inputs 210 is given by $$k_s(x_i, x_j) = \sigma_1^2 \frac{1}{\Gamma(\nu) 2^{\nu-1}} \left[\sqrt{2\nu} \sum_{d=1}^D \left(\frac{x_{id} - x_{jd}}{\rho_d}\right)\right]^\nu \times K_\nu\left(\sqrt{2\nu} \sum_{d=1}^D \left(\frac{x_{id} - x_{jd}}{\rho_d}\right)\right), \quad (4)$$

where $\Theta = [\sigma_1, \nu, \rho_1, \ldots, \rho_D]^T$ denotes the hyperparameters of the above covariance function. More specifically, $\sigma_1^2 > 0$ and $\nu > 0$ denote the signal variance and the smoothness parameter, respectively, and $\rho_D > 0$ represents the characteristic length scale for each input dimension. In addition, $\Gamma(.)$ is the Gamma function and $K_\nu(.)$ is the modified Bessel function of the second kind. As the value of the smoothness parameter $\nu$ increases, the function becomes more smooth. We consider a specific case where the value of $\nu$ is not too high, i.e., $\nu = 3/2$, such that the covariance is given by $$k_s(x_i, x_j) = \left(1 + \sqrt{3} \sum_{d=1}^D \left(\frac{x_{id} - x_{jd}}{\rho_d}\right)\right) \exp\left(-\sqrt{3} \sum_{d=1}^D \left(\frac{x_{id} - x_{jd}}{\rho_d}\right)\right). \quad (5)$$

Rational Quadratic Covariance Function:

A rational quadratic (RQ) covariance function for D-dimensional inputs 210 is defined as $$k_s(x_i, x_j) = \sigma_2^2 \left(1 + \frac{1}{2\alpha} \sum_{d=1}^D \left(\frac{x_{id} - x_{jd}}{\eta_d}\right)^2\right)^{-\alpha}. \quad (6)$$

The hyperparameters are given by $\Theta = [\sigma_2, \alpha, \eta_1, \ldots, \eta_D]^T$. In particular, $\sigma_2^2 > 0$ represents the signal variance, $\alpha > 0$ determines the smoothness and $\eta_d > 0$ corresponds to a characteristic length scale for the input dimension D.

Different structures of the dataset may be represented by combining covariance functions. At least one approach is to add together covariance Functions, which results in a valid new covariance function.

Recall that the output in (1) is assumed to be corrupted by additive Gaussian noise with variance $\sigma_n^2$. Therefore this noise term can be incorporated into the aforementioned covariance functions as follows:

$$k(x_i, x_j) = k_s(x_i, x_j) + \sigma_n^2 \delta_{ij}, \quad (7)$$

where $\delta_{ij}$ denotes the Kronecker delta, which takes value 1 if and only if i=j and 0 otherwise. In this setting, the distribution of y, given the latent function values f and the input X, is written as $$p(y|f, X) = N(f, \sigma_n^2 I), \quad (8)$$

where I is an N×N identity matrix. By using (2) and (8), the marginal distribution of y can be found to be $$p(y|X) = \int p(y|f,X) p(f|X) df = N(0, K+\sigma_n^2 I). \quad (9)$$

Based on (9), the marginal log-likelihood of y can be written as $$\log p(y \mid X, \Theta) = -\frac{1}{2} y^T (K + \sigma_n^2 I)^{-1} y \frac{1}{2} \log|K + \sigma_n^2 I| \frac{N}{2} \log 2\pi, \quad (10)$$

where |.| is the determinant of a matrix. The hyperparameters are optimized by maximizing the marginal log-likelihood function in (10). In this regard, the gradient of (10) with respect to the ith element of $\Theta$ is calculated as $$\frac{\partial \log p(y \mid X, \Theta)}{\partial \theta_i} = -\frac{1}{2} tr\left((K + \sigma_n^2 I)^{-1} \frac{\partial(K + \sigma_n^2 I)}{\partial \theta_i}\right) \quad (11)$$

$$\frac{1}{2} y^T (K + \sigma_n^2 I)^{-1} \frac{\partial(K + \sigma_n^2 I)}{\partial \theta_i} (K + \sigma_n^2 I)^{-1} y,$$

which allows the use of any gradient-based optimization method to find the optimal values of the hyperparameters that maximize the marginal log-likelihood function in (10). Note that the objective function is not necessarily convex, so that the gradient based method may converge to a local optimum. A possible approach to alleviate this problem may be to initialize multiple gradient based searches and then to choose the optimal point which yields the largest marginal log-likelihood. Further, such processes may be previously stored as one or more distribution selection procedure on the processor.

Estimation/Testing Stage

FIG. 2A further illustrates an estimation stage 240 according to embodiments of the disclosure. Unlike conventional methods which discard training data after the training stage, as noted above, the present disclosure further utilizes the training data 210, 220 in the estimation stage 240. For example, FIG. 2A shows the estimation stage 240 that takes inputs including: (1) training data input 210; (2) training data output 220; (3) the measurements of the physical quantities 201; and (4) the determined hyper-parameters 222 evaluated in the training stage 220, so that the estimation stage 240 outputs an SoC estimate 250.

Figure 2B:
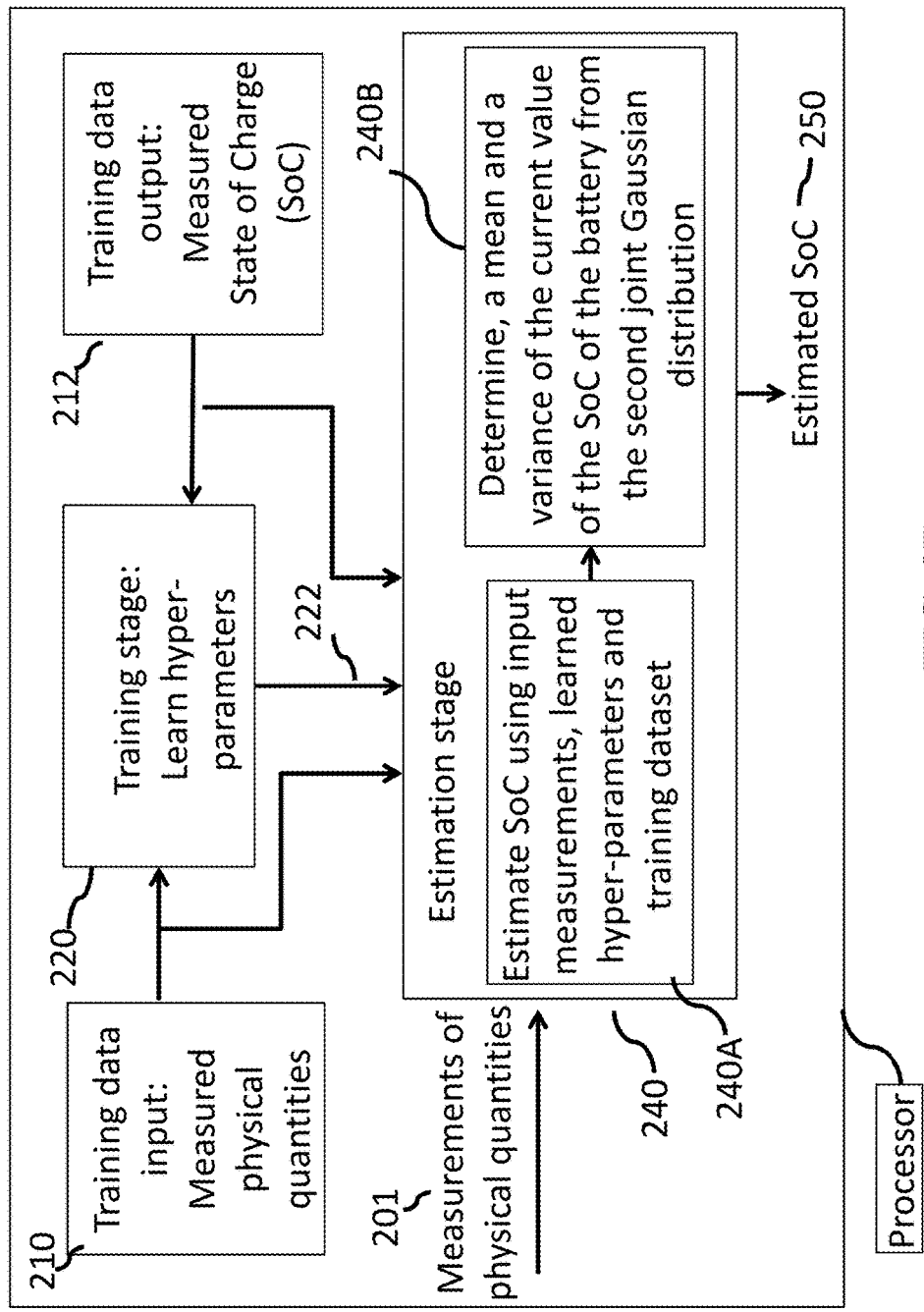

FIG. 2B illustrates aspects of FIG. 2A, for example, in the estimation stage 240, after determining the optimal hyper-parameters in the training stage 220, the joint distribution of y and y* can be expressed as the following $$p(y, y_* \mid X, x_*, \Theta) = N\left(\begin{bmatrix} 0 \\ 0 \end{bmatrix}, \begin{bmatrix} K + \sigma_n^2 I & k_* \\ k_*^T & k_{**} + \sigma_n^2 \end{bmatrix}\right), \quad (12)$$

where $k^* = [k(x_1, x^*), \ldots, k(x_N, x^*)]^T$ and $k^{**} = k(x^*, x^*)$. The main goal of GPR is to find the predictive distribution for a new input vector, $x^*$. In this regard, by marginalizing the joint distribution (12) over the training data set output y, we obtain the predictive distribution of test output, $y^*$, which is a Gaussian distribution, i.e., $p(y^*|X, y, x^*, \Theta) = N(\mu^*, \Sigma^*)$ with the mean and covariance given by $$\mu^* = k^{*T}(K + Y_n^2 I)^{-1} y \quad (13)$$

$$\Sigma^* = \sigma_n^2 + k^{**} - k^{*T}(K + \sigma_n^2 I)^{-1} k^*. \quad (14)$$

Observed from the equation in (13) that the mean $\mu^*$ of the predictive distribution is obtained as a linear combination of the noisy outputs, stored in the vector y, which is effectively the estimate of the test output. In addition, the variance of the predictive distribution in (14) is a measure of the uncertainty. By using (13) and (14), the $100(1-\alpha)\%$ confidence interval is computed as $$[\mu^* - z_{(1-\alpha)/2} \Sigma^*, \mu^* + z_{(1-\alpha)/2} \Sigma^*], \quad (15)$$

where $\alpha \in [0, 1]$ represents the confidence level and $z_{(1-\alpha)/2}$ is the critical value of the standard normal distribution. The confidence interval provides a range of values which is likely to contain the true value of the test output. In particular, smaller variance results in a narrower confidence interval, and hence indicates more precise estimates of the test output. Noted is that the GPR provides not only the estimated test output, but also gives a predictive probability distribution which is one of the practical advantages of GPR over SVM, NN and other non-probabilistic machine learning methods.

Still referring to FIG. 2B, the online estimation stage 240 estimates 241A battery SoC based on the current measurements of physical quantities, hyper-parameters learned in the training stage and, unlike conventional methods in the prior art, training dataset. For example, the estimation stage 240 includes determining, a first joint Gaussian distribution of values 220 of the SoC of the battery given a set of historical measured physical quantities 210 of the state of the battery and a corresponding set of values 212 of the SoC of the battery. Determining a second joint Gaussian distribution of SoC of the battery using the set of historical measured physical quantities 210 of the state of the battery and the corresponding set of values 212 of the SoC of the battery, current measurement physical quantities of the battery and the determined first joint Gaussian distribution. Finally, determining 241B, a mean and a variance of the current value of the SoC of the battery from the second joint Gaussian distribution, wherein the mean is an estimate of the current SoC of the battery, and the variance is a confidence of the estimate, wherein steps of the method are determined using the at least one processor.

Figure 3:
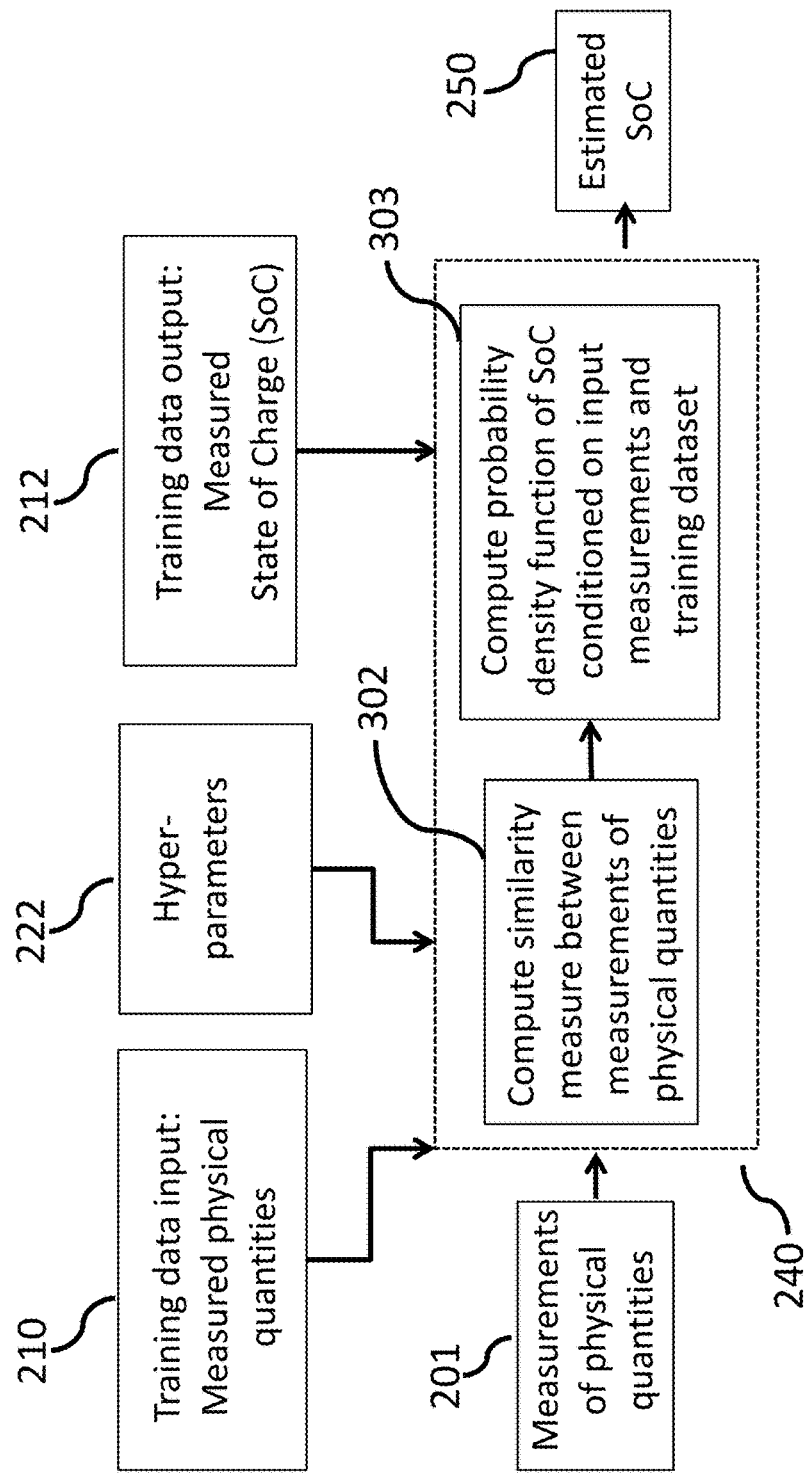
FIG. 3 illustrates a block diagram that further defines the estimation stage, according to embodiments of the disclosure.

FIG. 3 shows a block diagram of the estimation stage 240 of FIG. 2A that further includes an initial processing step 302 of the estimation stage 240, that computes some form of similarity measures between all pairs of an input measurement tuple 201 and measurement tuples from the training data input dataset 210. This is achieved by employing an appropriately selected kernel function which maps a pair of measurements into a real number representing similarity between them. The kernel function depends on hyper-parameters 222 computed in the training stage 220 and stored in the memory. The similarity measurements and output training data 212 are then used in the following step 303 to evaluate probability density function of SoC. Alternatively, the SoC estimate 250 is given as a weighted combination of the SoC values from the training data output 212, where the weights are computed based on similarity measures.

Measuring Similarity Between Measured Data and Training Data Points

Figure 4:
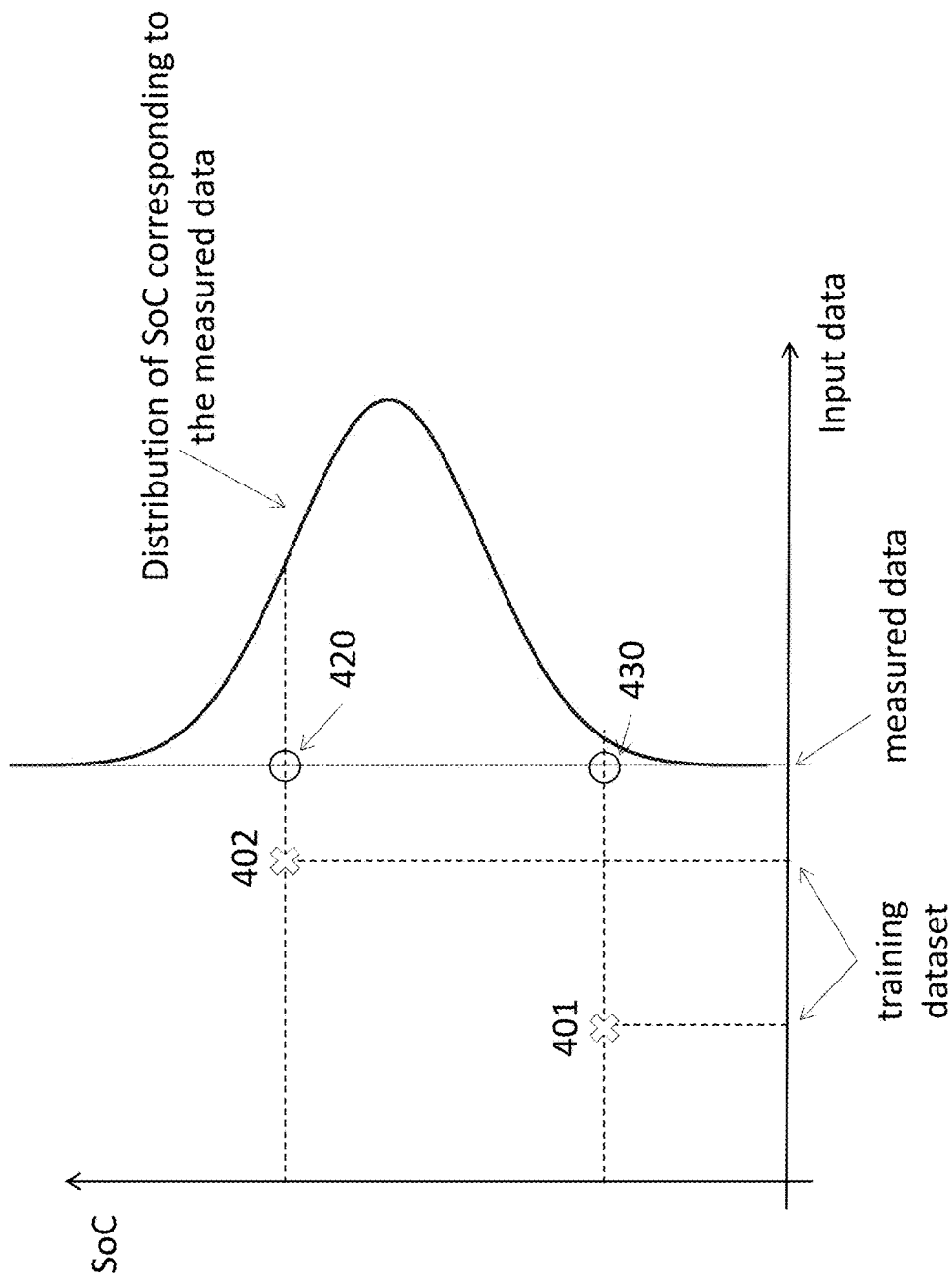
FIG. 4 illustrates processes regarding embodiments of the disclosure.
Figure 5:
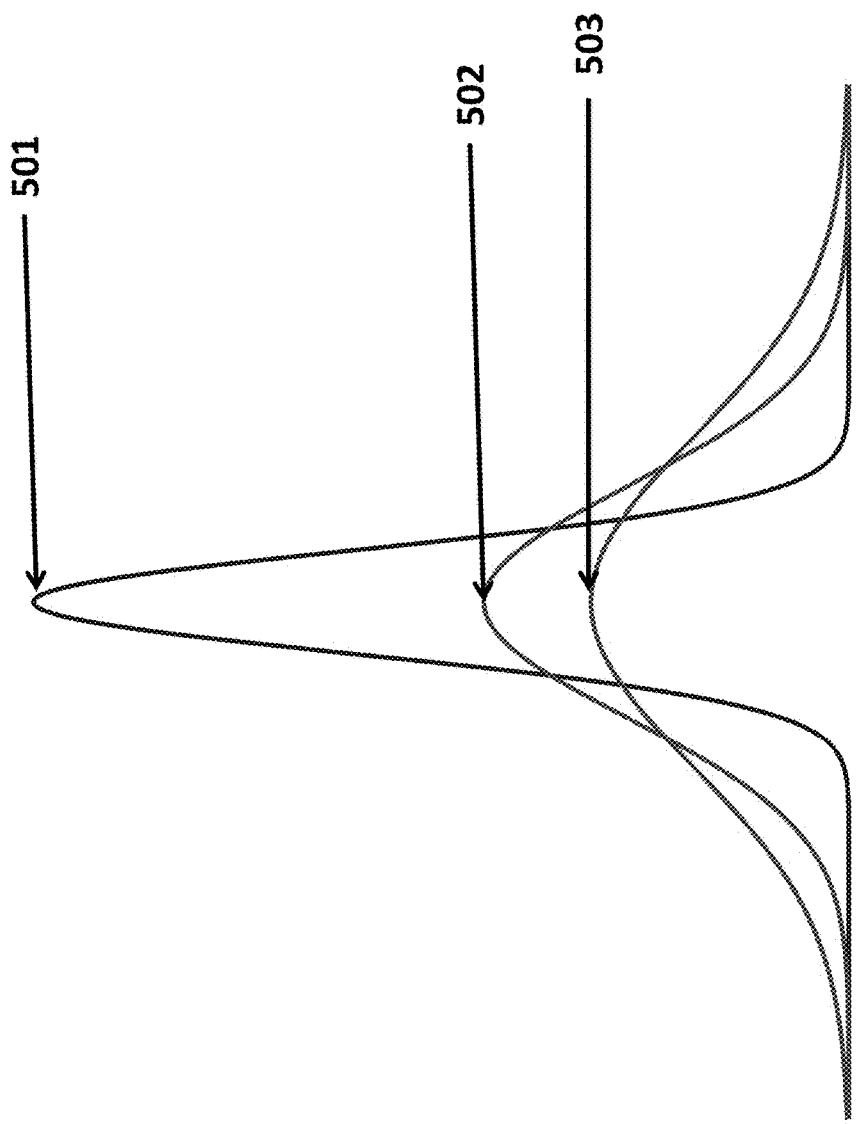
FIG. 5 illustrates three examples of probability distributions of FIG. 4, according to embodiments of the disclosure.

This intuition is illustrated in FIG. 4 and FIG. 5, wherein the training dataset contains two data points, 401 and 402. FIG. 4 illustrates processes regarding embodiments of the disclosure. FIG. 5 illustrates three examples of probability distributions of FIG. 4. Referring to FIG. 4, the SoC corresponding to the measured data 420 is estimated as a combination of the SoC's corresponding to the training data points 401, 402. The weights in this combination are obtained based on how similar the measured data point is to each of the training data points 401, 402. If a measured data point 420 is very similar to one of the training data points 402, then the SoC corresponding to that training data point appears in the combination with a large weight. In contrast, if there is almost no similarity between the measured data point 430 and one of the training data points 401, then the SoC corresponding to the training data point appears in the combination with the weight that is very close to 0.

Still referring to FIG. 4 and FIG. 5, along with the estimated SoC, the methods and systems also reports the confidence interval of the estimated SoC. The methods and systems inherently evaluates the probability distribution of the SoC corresponding to the measured data based on the historical data. Three examples of probability distributions are shown in FIG. 5. For example, if the distribution is peaked around its mean 501, this implies there is large confidence in the estimated SoC. Further, if the distribution is spread around its mean 502, this implies there is small confidence in the estimated SoC. Finally, if the distribution is very spread around its mean 503, then this implies there is very small confidence in the estimated SoC.

Intuitively, more peaked output distribution 501 implies more confidence in the estimated SoC. Referring again to FIG. 4, if the measured data point 420 is very similar to one of the points in the training data, then the reported SoC is almost the same as the SoC corresponding to that training data point 402, and the corresponding probability distribution is very peaked 501 around that SoC. In contrast, if the measured data point 430 is equally similar to both training data points 401, then the probability distribution of the resulting SoC is spread around the midpoint 502 between the SoC's corresponding to the training data points.

Training Stage Continued

Figure 6:
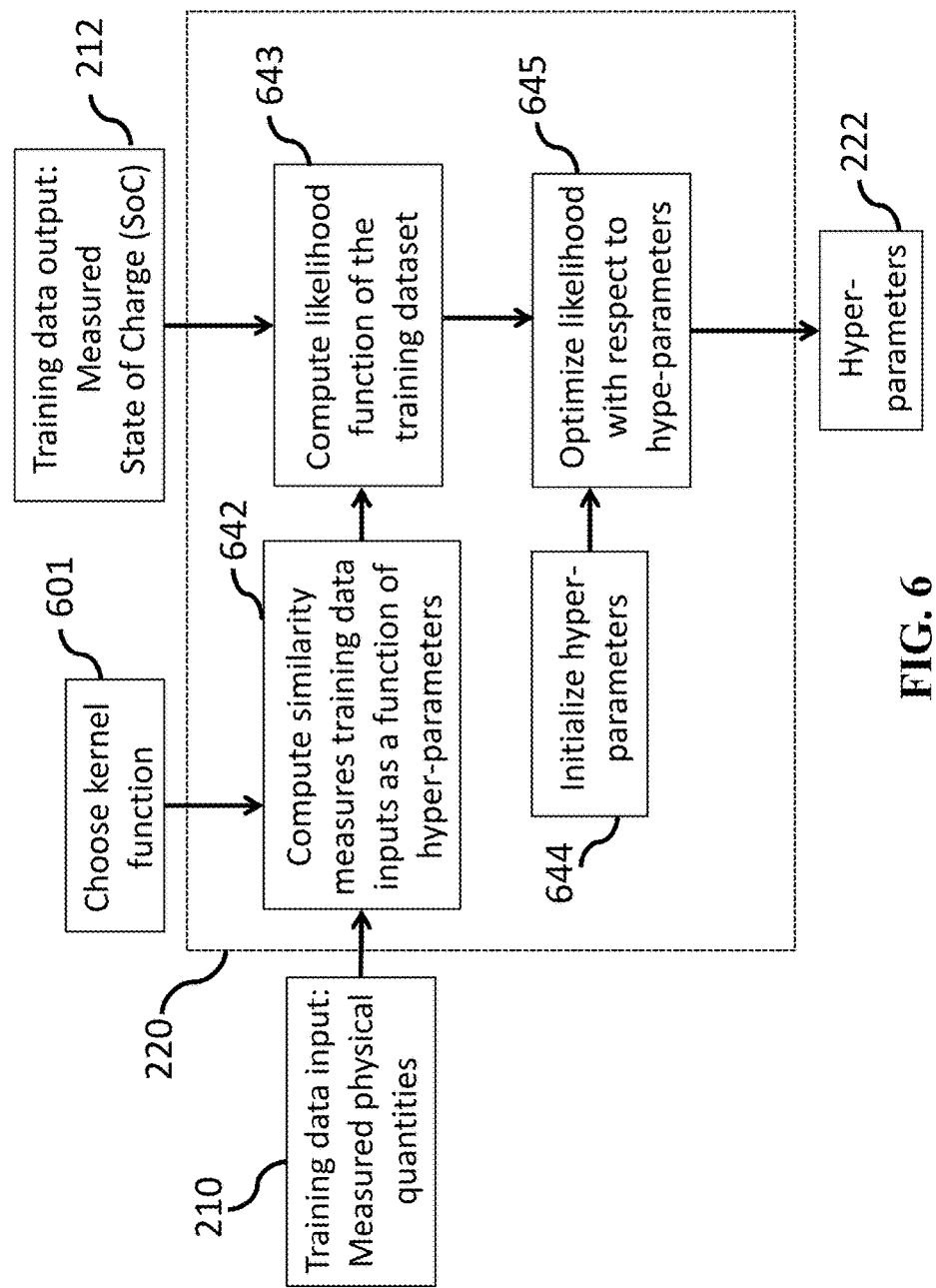
FIG. 6 illustrates a block diagram that further defines the training stage, according to embodiments of the disclosure.

FIG. 6 illustrates a block diagram of the training stage 220 in further detail of FIG. 2A. The SoC estimation 250 according to embodiments of the disclosure is tied to a kernel function 601 that the user needs to choose. There are many possible kernel functions, see examples above for some of the kernel functions. The training data input 210 and selected kernel function 601 are inputs to 642 which computes similarities between pairs of measurements in the input training dataset 210. These similarity measurements are functions of hyper-parameters 222 to be determined. The similarity measures are then used to specify the likelihood function 643 of the training data output 212. A likelihood function of the training dataset is casted as an objective function in the optimization routine 645 which finds values of the hyper-parameters which maximize the likelihood of the training dataset. The optimization routine 645 is started with some initial values of the hyper-parameters 644 which may be completely random or selected according to a chosen kernel function.

SoC Estimation Method Based on GPR

As noted above, FIG. 2A illustrates the novel SoC estimation method based on GPR, which provides a probabilistic, nonparametric model to estimate the SoC of lithium-ion batteries as a function of voltage, current and temperature of the battery. For example, a definition of the SoC of the battery includes the following.

The SoC of the battery at time t is defined as a percentage of the residual capacity of the battery Q(t) with respect to its rated capacity, $Q_r$, $$SoC(t) = \frac{Q(t)}{Q_r} \times 100\%. \tag{16}$$

Note that $Q(t) \in [0, Q_r]$. Above, $Q_r$ is defined as the maximum amount of charge that can be drawn from a new battery under certain conditions specified by the manufacturer in terms of the ampere-hours (Ah). The fully discharged battery has an SoC of 0% and SoC increases while the battery is being charged. Consequently, the fully charged battery reaches 100% SoC.

As noted above, FIG. 2A illustrates the disclosed method consisting of two parts, i.e., the training stage 220 and the estimation stage 240. First, as noted above, the training stage 220 is performed in which the optimal hyperparameters of the chosen covariance function are determined by using conjugate gradient method. Noted is that the SoC values in the training data are normalized to have zero mean by subtracting their sample mean. Then, the online SoC estimation of the battery is carried out based on voltage, current and temperature measurements of the battery, also noted above. More specifically, the mean of the predictive distribution corresponds to the SoC estimate.

At least one process example is provided of SoC estimation method using GPR of FIG. 2A, which is non-limiting in scope, and is illustrated merely for the purpose of understanding aspects of the disclosure. Aspects of steps of the process of SoC estimation method using GPR of FIG. 2A may include, among other things:

Step 1: Obtain the training data set, D=(X,y), where x contains voltage, current and temperature measurements of the battery, and y are the corresponding SoC values.

Step 2: Initialize the hyperparameters of the given covariance function:

for SE covariance function, $\Theta = [\sigma_0, l_1, l_2, l_3, \sigma_n] = [0,0,0,0,0]^T$, for Matèrn covariance function, $\Theta = [\sigma_1, \nu, \rho_1, \rho_2, \rho_3, \sigma_n] = [0,0,0,0,0,0]^T$, for RQ covariance function, $\Theta = [\sigma_2, \alpha, \eta_1, \eta_2, \eta_3]^T = [0,0,0,0,0]^T$, for the sum of Matèrn and RQ covariance functions, $\Theta = [\sigma_2, \alpha, \eta_1, \eta_2, \eta_3, \sigma_1, \nu, \rho_1, \rho_2, \rho_3, \sigma_n] = [0,0,0,0,0,0,0,0,0,0,0]^T$.

Step 3: Find the optimal hyperparameters that minimize the negative marginal log-likelihood function (equivalently maximize the marginal log-likelihood function) by using the conjugate gradient method.

Step 4: Estimation part:

Step 5: Obtain the predictive distribution given optimal hyperparameters, training data set, D, test input x*. The mean of the predictive distribution corresponds to the SoC estimate.

SoC Estimation Method Based on a Combination of GPR and Kalman Filter

Figure 7:
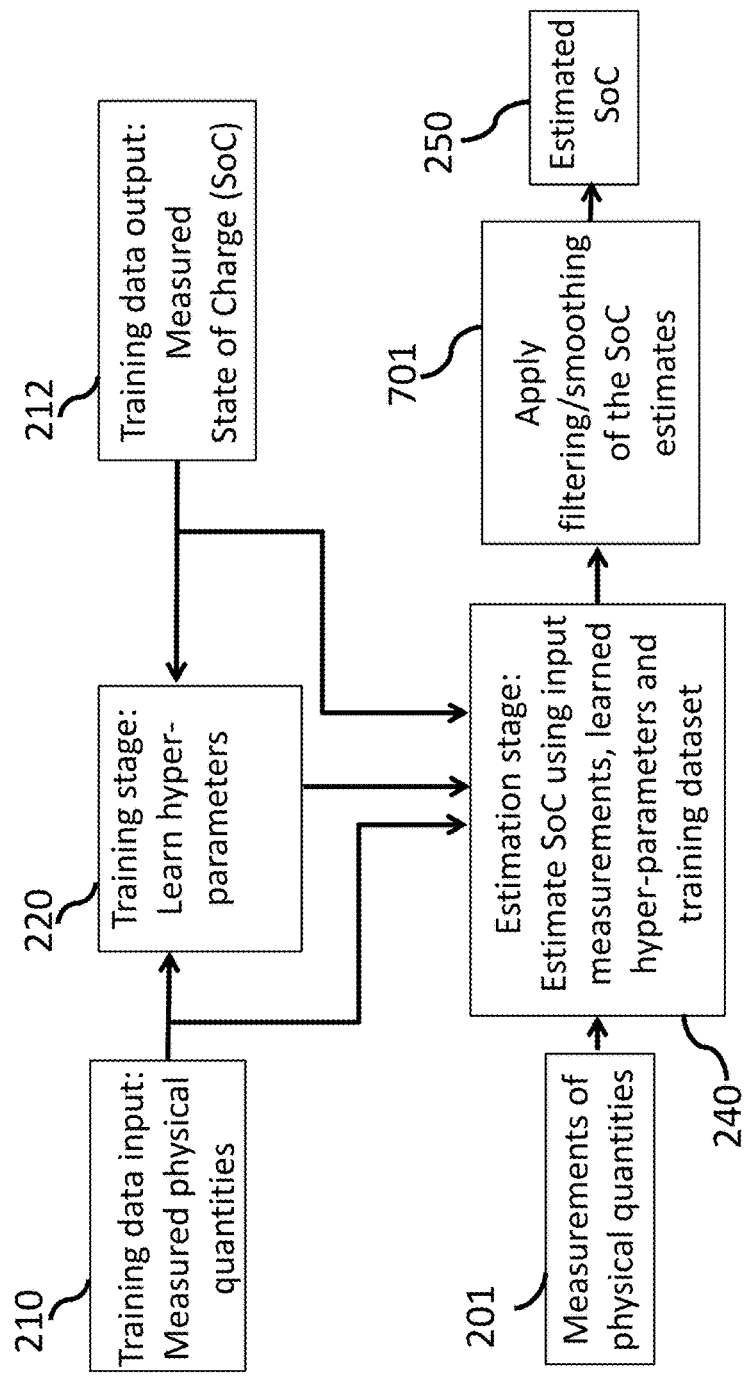
FIG. 7 illustrates a block diagram of an SoC estimation method based on a combination of GPR and Kalman Filter, according to another embodiment of the disclosure.

In another embodiment of the disclosure, FIG. 7 illustrates an SoC estimation method based on a combination of GPR and filtering of the GPR-based estimates. For example, in a situation where the estimated SoC 250 abruptly varies as a result of noise overfitting in the estimation stage 240, then an instructive to filter or smoothen out the consecutive SoC estimates can be used. Then, as another embodiment of the disclosure as shown in FIG. 7, the SoC estimates can be processed through a filter 701 which smoothens possible noise-induced variations in the SoC estimates. This can be achieved with, for example, moving average filtering. Alternatively, noting that in the output of the estimation stage 240 there may be access to the probability distribution of the SoC, 701 to implement the Kalman filter.

More specifically, at least one motivation behind incorporating the Kalman filtering of the GPR outputs is to reduce the estimation error, and hence obtain more accurate estimates. As illustrated in FIG. 7, where the output of the GPR, i.e. estimation stage 240 is fed into the Kalman filter 701, the state-space representation for the Kalman filter is given by State equation:

$$SoC(k+1) = SoC(k) - \frac{I_c(k)}{Q_r}\Delta t + \psi \quad (17)$$

Measurement equation:

$$y^*(k+1) = SoC(k+1) + \xi. \quad (18)$$

Above, k is the time index, $I_c$ is the current at time k, $\Delta t$ is the sampling period, $y^*(k+1)$ is the SoC estimate of GPR at time k+1, and $\psi$ represents the process noise assumed to be Gaussian distributed with zero mean and covariance, Q≥0, which is an adjustable parameter. In addition, $\xi$ denotes the measurement noise, which also follows Gaussian distribution with zero mean and covariance R>0, i.e., N(0, R). The state equation (17) is based on Coulomb counting, which calculates the SoC by integrating the measured current over time [16]. Also, the measurement in (18) is the SoC output of the GPR model. The two-step iterative process of the Kalman filter is given in the Algorithm below, where K denotes the Kalman gain, $\widehat{SoC}(k+1)$ and $P^1(k+1)$ represent the prior estimate and the prior error covariance at time k+1, respectively.

Accordingly, the Algorithm is disclosed as the following:

---

Set the parameters Q, R
Initialize P(0), k = 0
State prediction:

$$\widehat{SoC}^1(k+1) = \widehat{SoC}(k) - \frac{I_c(k)}{Q_r}\Delta t + \psi$$

$P^1(k+1) = P(k) + Q$
Measurment update:

$$K(k+1) = \frac{P^1(k+1)}{P^1(k+1)+R}$$

$$\widehat{SoC}(k+1) = \widehat{SoC}^1(k+1) + K(k+1)\left[y_*(k+1) - \widehat{SoC}^1(k+1)\right]$$

$P(k+1) = [1 - K(k+1)]P^1(k+1)$

---

Figure 8:
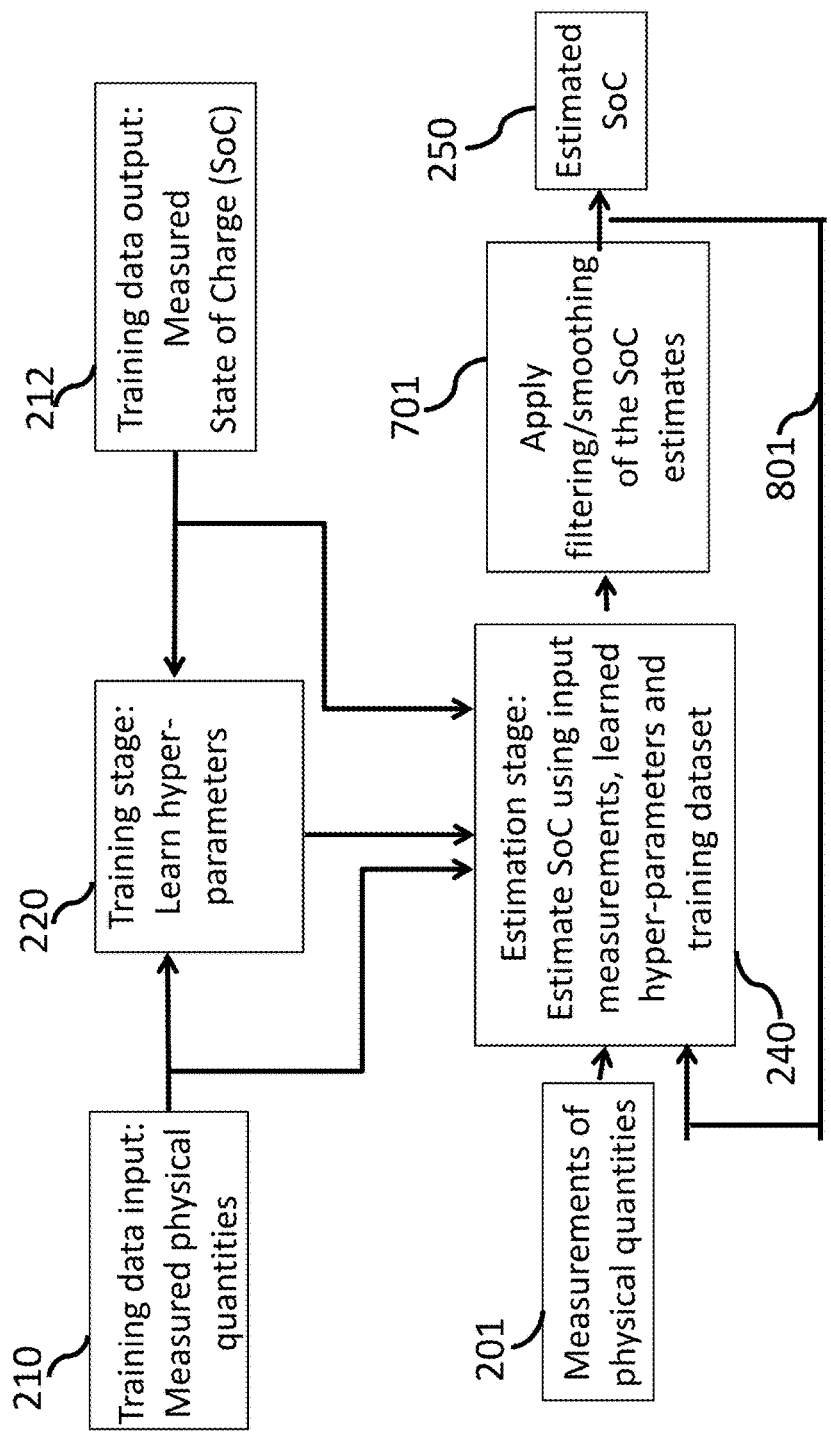
FIG. 8 illustrates a block diagram a feedback of a certain number of previous SoC estimates to the input of the estimation stage, according to another embodiment of the disclosure.

In another embodiment of the disclosure, FIG. 8 illustrates a feedback of a certain number of previous SoC estimates 801 to the input of the estimation stage 240. In particular, with that, the noise-induced variation in the SoC estimates can be further reduced and hence the estimation accuracy improves. Noted is that the training stage 220, which delivers hyper-parameters 222, slightly changes to accommodate the existence of the feedback loop.

Figure 9:
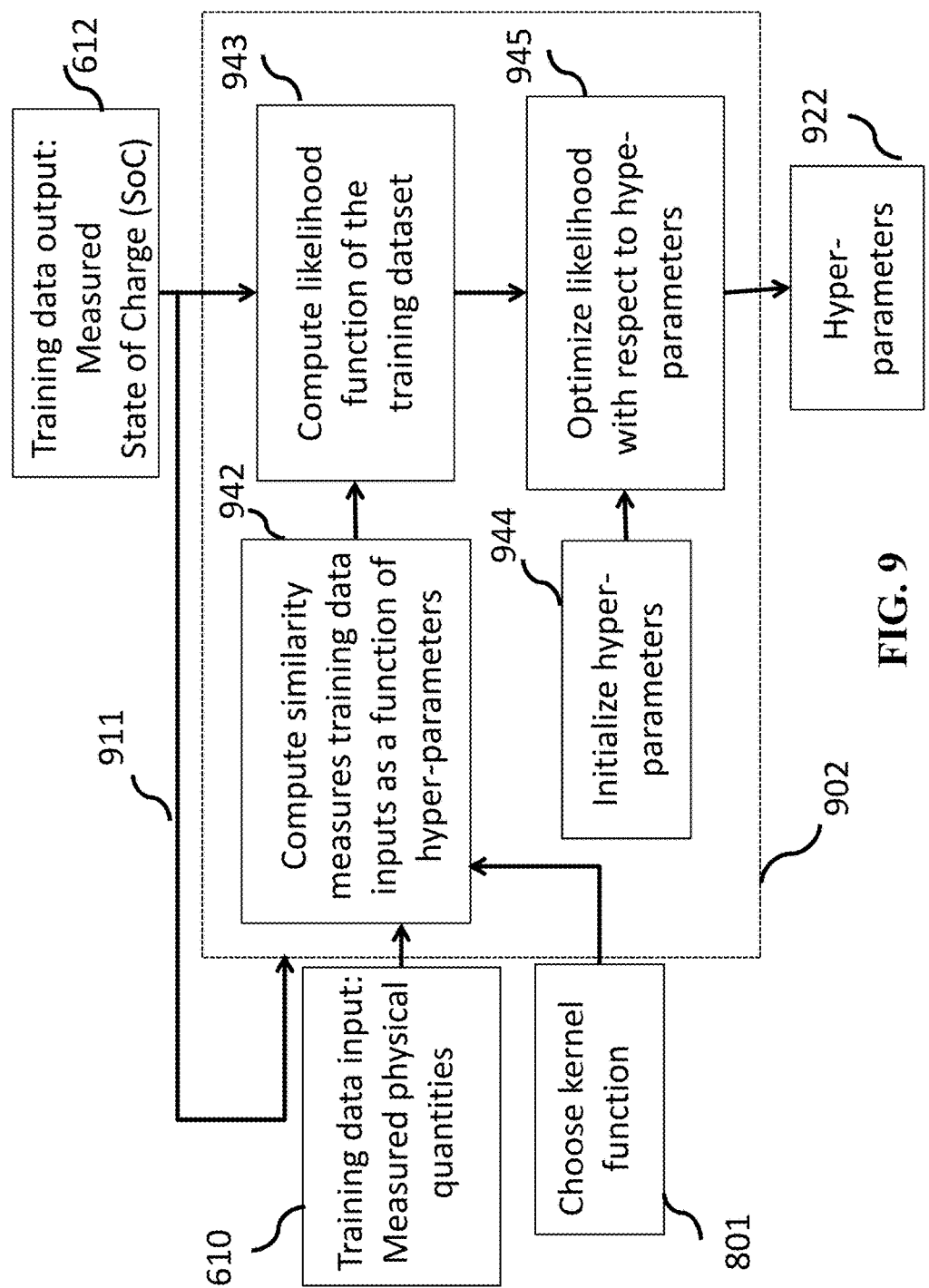
FIG. 9 illustrates a block diagram of a training stage of FIG. 8, according to embodiments of the disclosure.

FIG. 9 illustrates a training stage of FIG. 8, wherein the step of 942 computes similarities between training data points (as similar to step 642 of FIG. 6), where each data point consists of measured physical quantities 210 and a predefined number of previously recorded SoC values 911. The likelihood function of the training data is computed in 943 based on similarity measures (as similar to step 643 of FIG. 6). The hyper-parameters 922 (as similar to step 222 of FIG. 6) are obtained as an argument which optimizes likelihood function using some optimization routine implemented in 945 (as similar to step 645 of FIG. 6) and initialized with 944 (as similar to step 644 of FIG. 6).

Sparse GPR

Instead of using all training dataset as in regular GPR, a subset of training data points, called inducing points are used for training the regression model. Therefore, the proposed method significantly reduces the computational complexity when the size of the training dataset exceeds a few thousand. The computational cost of a regular GPR is reduced by introducing inducing variables and modifying the joint prior distribution, $p(f^*, f)$. Let $u=[u_1, \ldots, u_m]^T$ denote the inducing variables which correspond to a set of input locations $X_u$ called inducing points. The inducing points are chosen as a subset of the data points. Given the inducing points, the joint prior distribution, $p(f^*, f)$ can be rewritten as $$p(f^*,f) = \int p(f^*,f|u)p(u)du, \quad (19)$$

where $p(u)=N(0, K_{u,u})$. It is assumed that $f^*$ and $f$ are conditionally independent given u for the approximation of $p(f^*, f)$ in the following $$p(f^*,f) \approx q(f^*,f) = \int q(f^*|u)q(f|u)p(u)du. \quad (20)$$

Subsequently, it is assumed that the training conditional $q(f|u)$ is fully independent and the test conditional remains exact as $$q(f|u) = \prod_{n=1}^{N} p(f_n|u) = N(K_{f,u}K_{u,u}^{-1}u, \text{diag}[K_{f,f} - Q_{f,f}]), \quad (21)$$

$$q(f_*|u) = p(f_*|u), \quad (22)$$

where diag[A] denotes the diagonal matrix in which all of the diagonal elements equal the corresponding elements of A and other elements are zero. By inserting above distributions into (2) and integrating over u, the joint prior is given by $$q(f, f_*) = N\left(0, \begin{bmatrix} Q_{f,f} - \text{diag}[Q_{f,f} - K_{f,f}] & Q_{f,*} \\ Q_{*,f} & K_{*,*} \end{bmatrix}\right) \quad (23)$$

where $Q_{a,b}=K_{a,u}K_{u,u}^{-1}K_{u,b}$ is a low-rank matrix (i.e., rank M). Using the above joint prior distribution, the predictive distribution is obtained as $$q(y^*|X,y,x^*,\Theta) = N(\tilde{\mu}^*, \tilde{\Sigma}^*) \quad (24)$$

where $$\tilde{\mu}^* = K_{*,u}\Omega K_{u,f}\Lambda^{-1}y \quad (25)$$

$$\tilde{\Sigma}^* = \sigma_n^2 + K_{*,*} - Q_{*,*} + K_{*,u}\Omega K_{u,*}. \quad (26)$$

Above, $\Omega=(K_{u,u}+K_{u,f}\Lambda^{-1}K_{f,u})^{-1}$ and $\Lambda=\text{diag}[K_{f,f}-Q_{f,f}+\sigma_n^2 I]$. It is seen that the only matrix requiring inversion is the N×N diagonal matrix $\Lambda$, which yields a significant reduction in computational complexity. The computational cost of training becomes $O(NM^2)$ that is linear in N and a larger M leads to better accuracy at the expense of increased computational requirements. Also, testing time complexity is $O(M)$ and $O(M^2)$ for calculating the mean and the variance, respectively.

Performance Evaluation

According to aspects of the disclosure, the SoC estimation methods and systems of the disclosure for Li-ion batteries are validated based on the methods of GPR and a combination of GPR and Kalman filter, with data obtained from testing the battery under constant charge and discharge current. Also identified, is the impact of covariance function selection on the estimation performance for both methods. The root mean square error (RMSE) and maximum absolute error (MAE) are chosen as the main performance metrics, which are respectively defined as follows $$RMSE = \sqrt{\frac{1}{N_t}\sum_{i=1}^{N_t}(y_{*,i}^{true}-\hat{y}_{*,i}^{est})^2}, \quad (27)$$

$$MAE = \max|y_*^{true}-\hat{y}_*^{est}|, \quad (28)$$

where $N_t$ denotes the size of test data, $y^{*true}$ is a $1 \times N_t$ vector including SoC values of the test data and $\hat{y}^{*est}$ is a $1 \times N_t$ vector containing the estimated SoC values. In the following subsections, is first described a battery dataset, and then presented the SoC estimation results of the proposed methods.

Dataset

FIG. 10 illustrates a data set including voltage, current, temperature and SoC of the battery vs. time during five charging-discharging cycles. The dataset was collected from a LiMn2O4/hard-carbon battery with a nominal capacity of 4.93 Ah in the Advanced Technology R&D Center, Mitsubishi Electric Corporation. In particular, five consecutive cycles of charging and discharging at 10 C-rates were performed using a rechargeable battery test equipment produced by Fujitsu Telecom Networks. The battery voltage, temperature and current were measured during the experiment. The sampling period was chosen to be 1 second.

Specifically, FIG. 10 shows the dataset, where the negative values of the current indicate that the battery is being discharged. The GPR model is trained offline in which the optimal hyperparameters are determined for a given covariance function using the first samples of voltage 1005, temperature 1010 and current measurements 1015. The remaining 900 samples are used to verify the performance of the proposed SoC estimation methods 1020.

Example 1: Performance of SoC Estimation Method Based on GPR

Figures 11A, 11B:
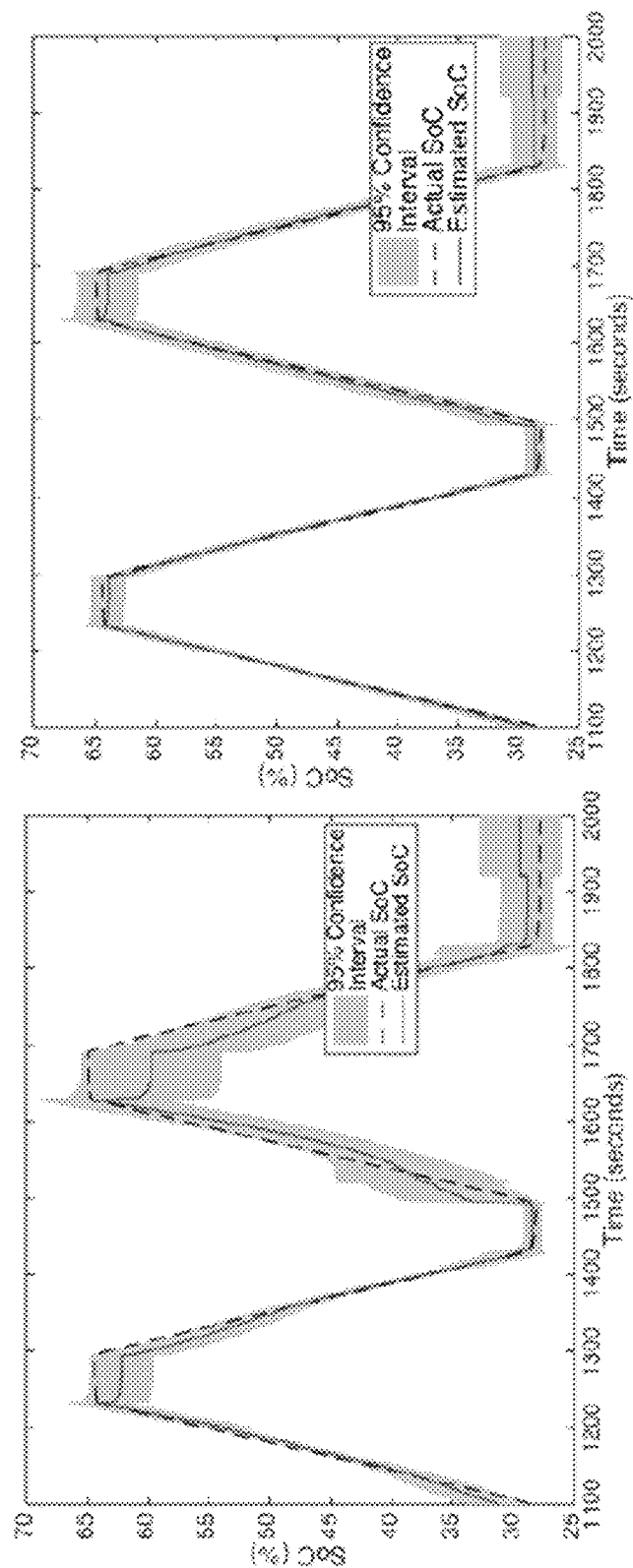
FIGS. 11A-11C illustrate graphs analyzing the performance of SoC estimation using GPR in terms of RMSE and MAE, wherein FIGS. 11A-11C display the actual SoC, the estimated SoC values and 95% confidence interval for four covariance functions.
Figures 11C, 11D:
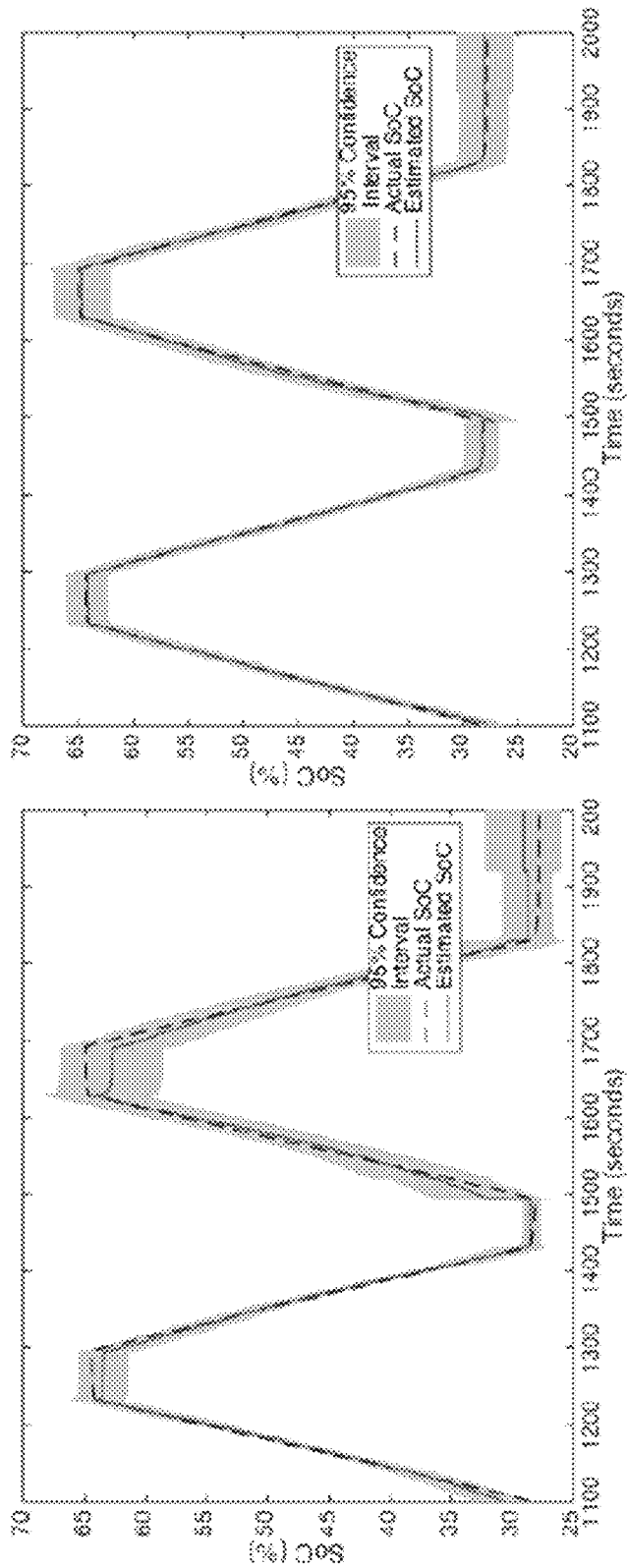
FIG. 11D corresponds to the sum of Matèrn and RQ covariance functions, according to embodiments of the disclosure.

Referring to FIG. 11A, FIG. 11B, FIG. 11C and FIG. 11D, in regard to analyzing the performance of SoC estimation using GPR in terms of RMSE and MAE. Specifically, FIGS. 11A-11C display the actual SoC, the estimated SoC values and 95% confidence interval for four covariance functions, wherein, FIG. 11A shows the squared exponential (SE) covariance function 1103, FIG. 11B shows the Matèrn covariance function 1106, FIG. 11C shows rational quadratic (RQ) covariance function 1109 and FIG. 11D shows sum of Matèrn and RQ covariance functions 1111. The shaded area (in Blue) represents the 95% confidence interval. The corresponding RMSE and MAE values are listed in Table 1.

TABLE 1

| Covariance Functions | RMSE (%) | MAE (%) |
|---|---|---|
| Squared Exponential (SE) (a) | 2.5369 | 7.4829 |
| Matèrn (b) | 0.7273 | 2.1796 |
| Rational Quadratic (RQ) (c) | 1.1233 | 3.6897 |
| Sum of Matèrn and RQ (d) | 0.4588 | 1.5502 |

Upon review, the SoC estimation performance appears to heavily depend on the choice of the covariance function. For instance, GPR with SE covariance function does not adequately represent the data, hence results in less accurate SoC estimates with higher RMSE=2.5369% and MAE=7.4829%. On the other hand, GPR with Matèrn and RQ covariance functions give reasonable SoC estimates with RMSE (%)=0.7273, MAE (%)=2.1796, and RMSE (%)=1.1233, MAE (%)=3.6897, respectively. Thus, this leads one to consider the sum of Matèrn and RQ covariance functions. Observed from FIGS. 11A-11C, is that the GPR with the sum of Matèrn and RQ covariance functions provides a better fit to the data, when compared to that attained with the other three covariance functions. In particular, RMSE is 0.4588% and MAE is 1.5502%, which implies good accuracy.

Also observed from the FIGS. 11A-11C, is that there is a higher uncertainty, hence larger confidence interval when the difference between the actual and the estimated SoC values is higher. Whereas accurate SoC estimates result in lower uncertainty, thus smaller confidence interval. Such that this uncertainty characterization is at least one of the key advantages of the GPR-based methods over non-probabilistic machine learning methods such as SVM, NN, among other things.

The optimal hyperparameters associated with each input variable enable one to infer the relative importance of the inputs. For example, in the case of GPR with SE covariance function (FIG. 11A), smaller values of the characteristic length scales imply that the corresponding input dimension is more important and relevant. The optimal values of the characteristic length scales for voltage, current and temperature are 0.1670, 54.3450 and 5.9635, respectively, which indicates that voltage has more impact than temperature, and temperature has more impact than current on the SoC estimate. Noted is that the same relative importance order is observed for the other three covariance functions. However, noted is that the optimal values of the corresponding hyper parameters have not been included, merely for the sake of brevity.

Figures 12A, 12B:
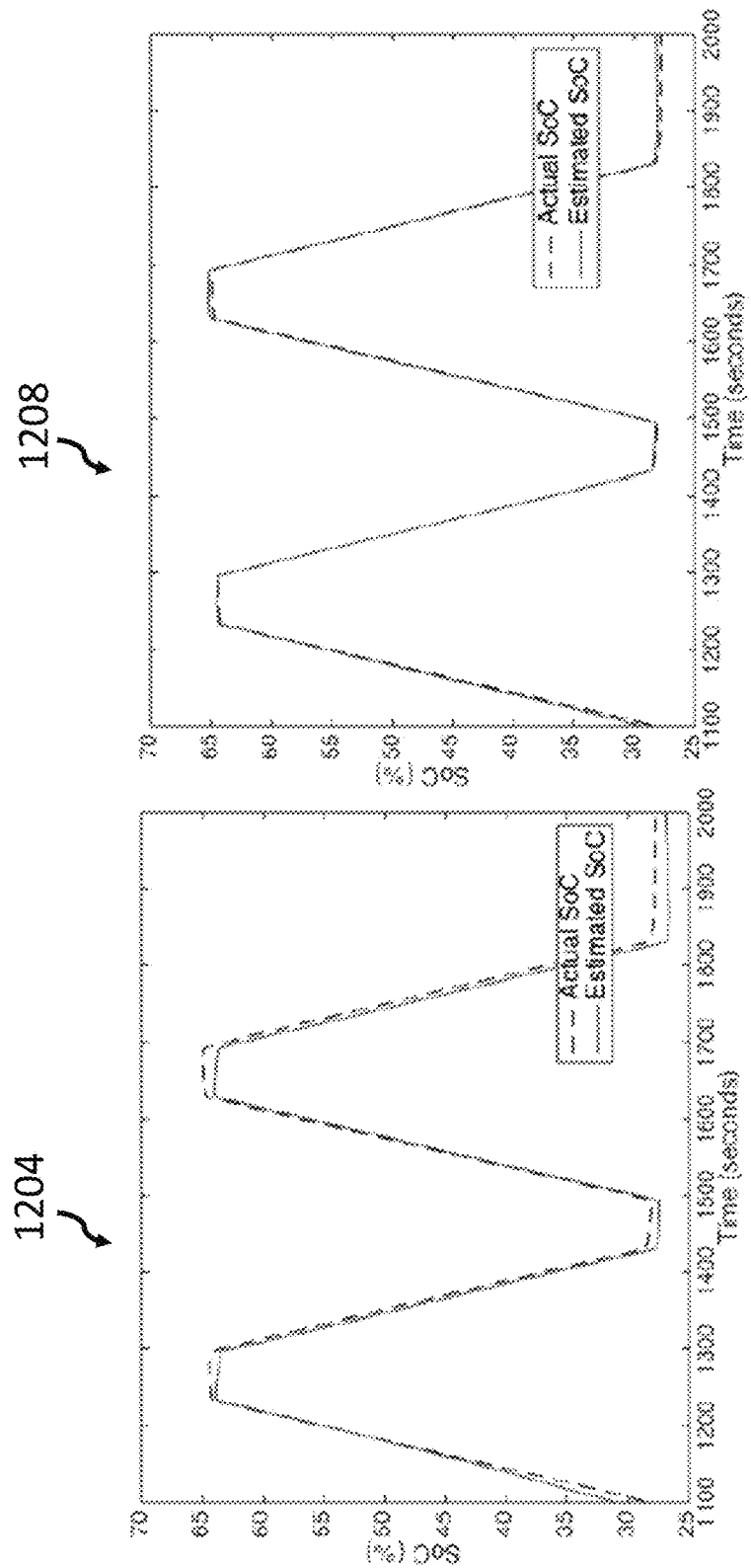
Figures 12C, 12D:
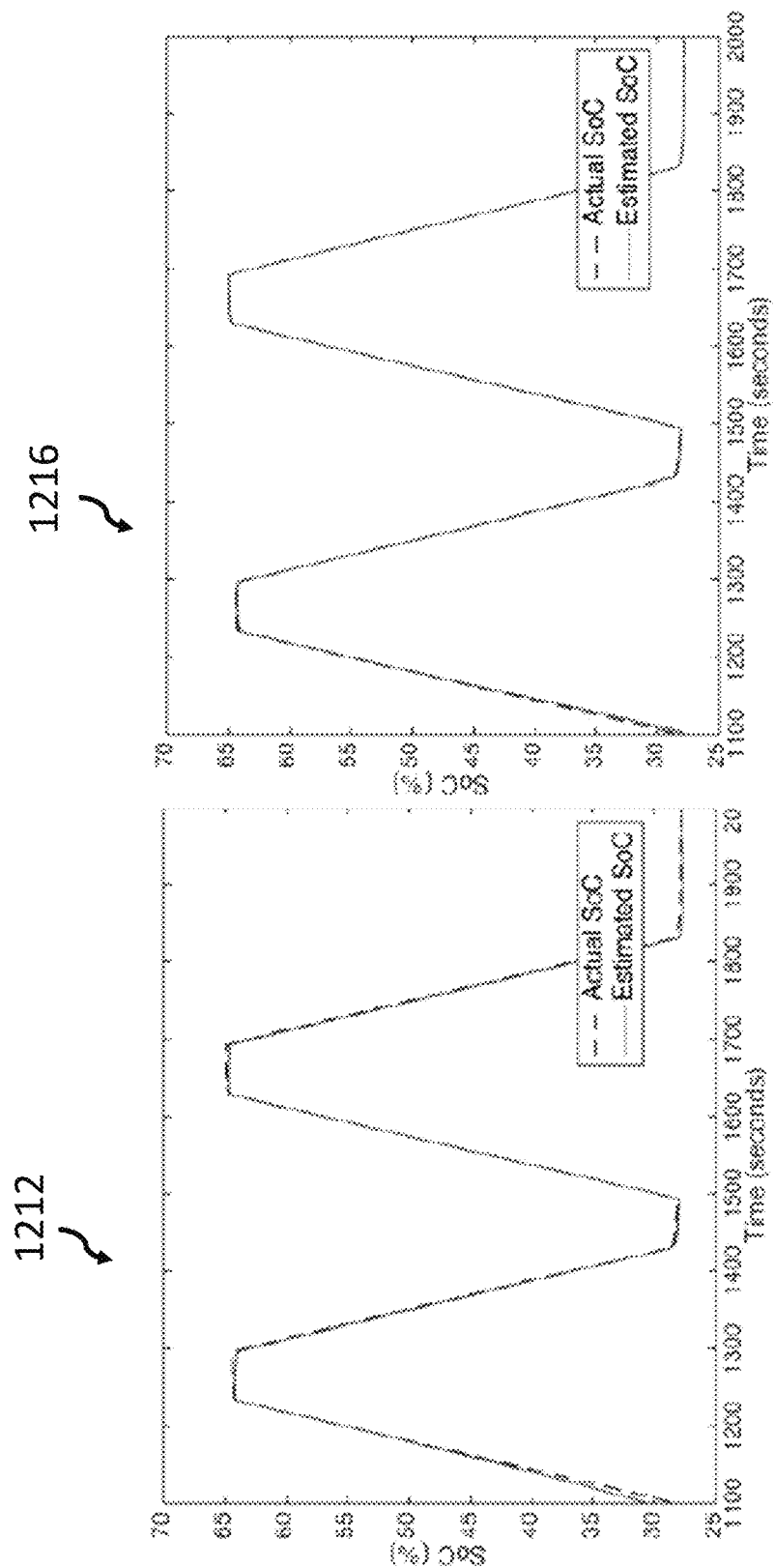

Example 2: Performance of SoC Estimation Method Based on a Combination of GPR and Kalman Filter Referring to FIG. 12A, FIG. 12B, FIG. 12C and FIG. 12D, in regard to evaluating, the performance of SoC estimation method based on the combination of the GPR and Kalman filter, and in comparison with the above section, the output of the GPR is fed into Kalman filter. For example, FIGS. 12A-12C show plots of the actual SoC, the estimated SoC values and 95% confidence interval for different covariance functions, wherein, FIG. 12A shows the squared exponential (SE) covariance function 1204, FIG. 12B shows the Matèrn covariance function 1208, FIG. 12C shows rational quadratic (RQ) covariance function 1212 and FIG. 12D shows sum of Matèrn and RQ covariance functions 1216. The resulting RMSE and MAE values are shown in Table 2.

TABLE 2

| Covariance Functions | RMSE (%) | MAE (%) |
|---|---|---|
| Squared Exponential (SE) (a) | 1.0824 | 2.6305 |
| Matern (b) | 0.2931 | 1.1443 |
| Rational Quadratic (RQ) (c) | 0.4126 | 2.1418 |
| Sum of Matern and RQ (d) | 0.2070 | 0.9802 |

Specifically, Kalman filter is an algorithm that can be implemented wherein substantial improvements in terms of the RMSE and MAE, for all of the covariance functions are made by applying the Kalman filter. In particular, RMSE is below 1.1% and MAE is below 2.7%. The choice of the sum of Matèrn and RQ covariance functions again gives the best accuracy, i.e., RMSE=0.2070% and MAE=0.9802%, which is almost a perfect fit to the actual SoC values.

Based upon the results the accuracy of the disclosed method, i.e., RMSE is less than 0.46% and MAE is less than 1.56% when the sum of Matern and RQ covariance functions is used can be confirmed. Also, in view of the effects of the covariance functions on the estimation performance, observed is that GPR with the sum of Matern and RQ covariance functions represents the data soundly. Also presented is the uncertainty representation through 95% confidence interval, which enables one to evaluate the reliability of the SoC estimation. Moreover, having identified the relative importance of the input variables on the estimation performance, or more specifically, that voltage is found to have more impact than temperature, and temperature has more impact than current on estimating the SoC. By further incorporating the Kalman filter into the GPR, more accurate estimation results are obtained. In particular, when GPR with the sum of Matern and RQ covariance functions is applied, there is an achievement of RMSE below 0.21% and MAE below 0.99%.

Figure 13:
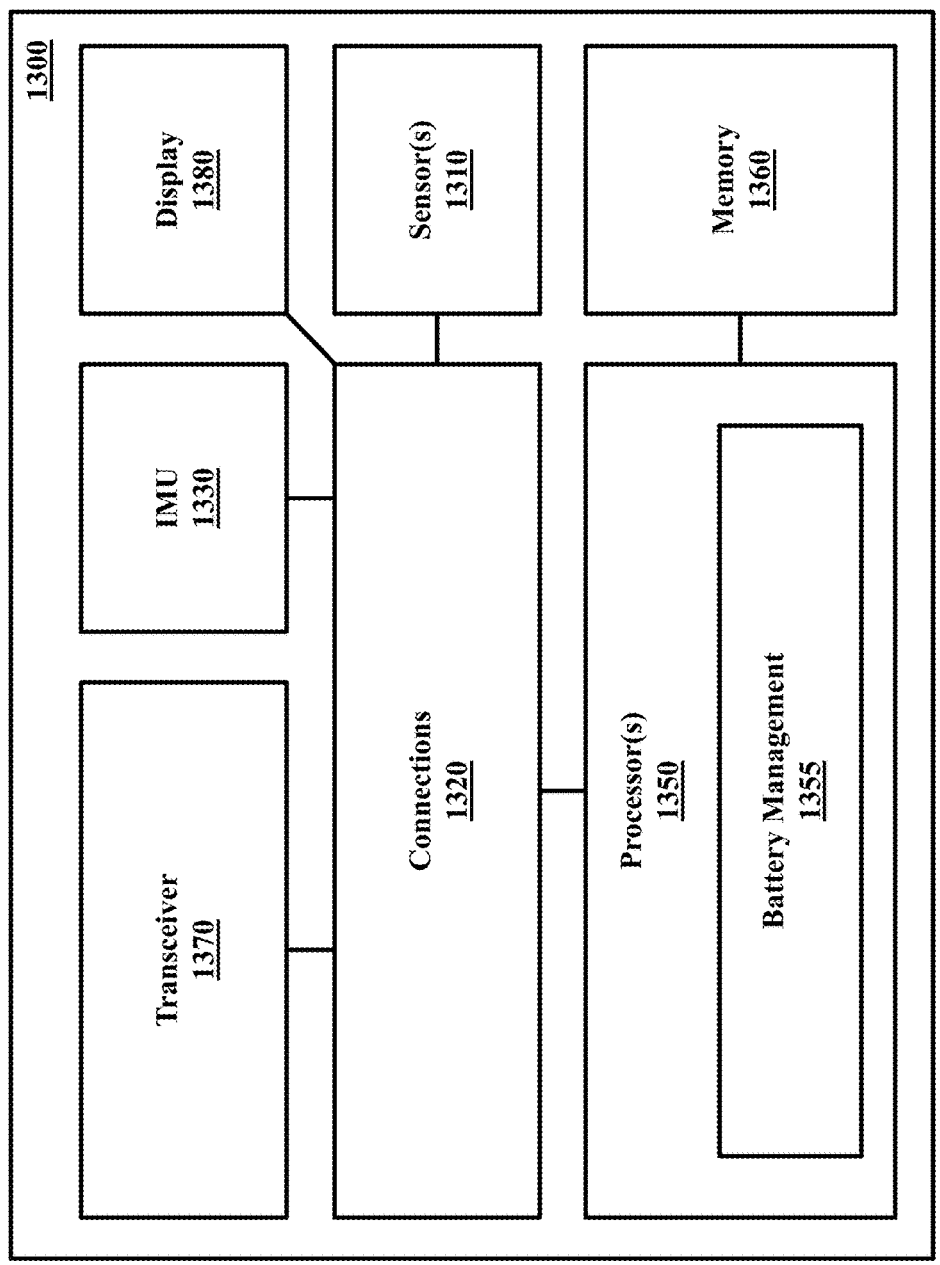
FIG. 13 illustrates shows a block diagram of at least system configured for determining the SoC of the battery, according to some embodiments of the disclosure.

FIG. 13 shows a block diagram of an exemplary system 1300 configured for determining the SoC of the battery according to some embodiments of the disclosure. The system 1300 can be implemented integral with the battery or machinery having the battery. Additionally or alternatively, the system 1300 can be communicatively connected to the sensors measuring physical quantities of the battery.

The system 1300 can include one or combination of sensors 1310, an inertial measurement unit (IMU) 1330, a processor 1350, a memory 1360, a transceiver 1370, and a display/screen 1380, which can be operatively coupled to other components through connections 1320. The connections 1320 can comprise buses, lines, fibers, links or combination thereof.

The transceiver 1370 can, for example, include a transmitter enabled to transmit one or more signals over one or more types of wireless communication networks and a receiver to receive one or more signals transmitted over the one or more types of wireless communication networks. The transceiver 1370 can permit communication with wireless networks based on a variety of technologies such as, but not limited to, femtocells, Wi-Fi networks or Wireless Local Area Networks (WLANs), which may be based on the IEEE 802.11 family of standards, Wireless Personal Area Networks (WPANS) such Bluetooth, Near Field Communication (NFC), networks based on the IEEE 802.15x family of standards, and/or Wireless Wide Area Networks (WWANs) such as LTE, WiMAX, etc. The system 400 can also include one or more ports for communicating over wired networks.

In some embodiments, the system 1300 can comprise sensors for measuring physical quantities of the battery, which are hereinafter referred to as "sensor 1310". For example, the sensor 1310 can include a voltmeter for measuring voltage of the battery, an ammeter for measuring current of the battery, and a thermometer for measuring temperature of the battery.

The system 1300 can also include a screen or display 1380 rendering information about the SoC of the battery. In some embodiments, the display 1380 can also be used to display measurements from the sensor 1310. In some embodiments, the display 1380 can include and/or be housed with a touchscreen to permit users to input data via some combination of virtual keyboards, icons, menus, or other GUIs, user gestures and/or input devices such as styli and other writing implements. In some embodiments, the display 480 can be implemented using a liquid crystal display (LCD) display or a light emitting diode (LED) display, such as an organic LED (OLED) display. In other embodiments, the display 480 can be a wearable display.

In some embodiments, the result of the fusion can be rendered on the display 1380 or submitted to different applications that can be internal or external to the system 1300. For example, a battery management application 1355 running on the processor 1350 can implement and execute various battery management methods.

Exemplary system 1300 can also be modified in various ways in a manner consistent with the disclosure, such as, by adding, combining, or omitting one or more of the functional blocks shown. For example, in some configurations, the system 1300 does not include the IMU 1330 or the transceiver 1370.

The processor 1350 can be implemented using a combination of hardware, firmware, and software. The processor 1350 can represent one or more circuits configurable to perform at least a portion of a computing procedure or process related to sensor fusion and/or methods for further processing the fused measurements. The processor 1350 retrieves instructions and/or data from memory 1360. The processor 1350 can be implemented using one or more application specific integrated circuits (ASICs), central and/or graphical processing units (CPUs and/or GPUs), digital signal processors (DSPs), digital signal processing devices (DSPDs), programmable logic devices (PLDs), field programmable gate arrays (FPGAs), controllers, micro-controllers, microprocessors, embedded processor cores, electronic devices, other electronic units designed to perform the functions described herein, or a combination thereof.

The memory 1360 can be implemented within the processor 1350 and/or external to the processor 1350. As used herein the term "memory" refers to any type of long term, short term, volatile, nonvolatile, or other memory and is not to be limited to any particular type of memory or number of memories, or type of physical media upon which memory is stored. In some embodiments, the memory 1360 holds program codes that facilitate SoC estimation, and other tasks performed by the processor 1350. For example, the memory 1360 can store the measurements of the sensors as well as the estimation determined during the training stage.

In general, the memory 1360 can represent any data storage mechanism. The memory 1360 can include, for example, a primary memory and/or a secondary memory. The primary memory can include, for example, a random access memory, read only memory, etc. While illustrated in FIG. 13 as being separate from the processors 1350, it should be understood that all or part of a primary memory can be provided within or otherwise co-located and/or coupled to the processors 1350.

Secondary memory can include, for example, the same or similar type of memory as primary memory and/or one or more data storage devices or systems, such as, for example, flash/USB memory drives, memory card drives, disk drives, optical disc drives, tape drives, solid state drives, hybrid drives etc. In certain implementations, secondary memory can be operatively receptive of, or otherwise configurable to a non-transitory computer-readable medium in a removable media drive (not shown). In some embodiments, the non-transitory computer readable medium forms part of the memory 1360 and/or the processor 1350.

All patents, patent applications, and published references cited herein are hereby incorporated by reference in their entirety. Emphasized is that the above-described embodiments of the present disclosure are merely possible examples of implementations, merely set forth for a clear understanding of the principles of the disclosure. Many variations and modifications may be made to the above-described embodiment(s) without departing substantially from the spirit and principles of the disclosure. Appreciated is that several of the above-disclosed and other features and functions, or alternatives thereof, may be desirably combined into many other different systems or applications. All such modifications and variations are intended to be included herein within the scope of this disclosure, as fall within the scope of the appended claims.

What is claimed is:

1. A method for estimating a state of charge (SoC) of a battery while the battery is in communication with at least one processor connected to a memory, the at least one processor receiving, via a transceiver, current measured physical quantities of the battery from sensors operatively connected to the battery, the method comprising:
    using the at least one processor for
        determining a first joint Gaussian distribution of values of the SoC of the battery from a set of historical measured physical quantities of the state of the battery and a corresponding set of historical values of the SoC of the battery, stored in the memory;
        determining a second joint Gaussian distribution of values of the SoC of the battery using the set of historical measured physical quantities of the state of the battery and the corresponding set of historical values of the SoC of the battery, the current measured physical quantities of the battery, and the determined first joint Gaussian distribution; and
        determining a mean and a variance of a current SoC of the battery from the second joint Gaussian distribution, wherein the mean is an estimate of the current SoC of the battery, and the variance is a confidence of the estimate, wherein the method assists in improving a battery life by protecting the battery from over-discharge and over-charge events.

2. The method of claim 1, wherein the set of historical measured physical quantities of the state of the battery and measured values from determining the current estimate of the SoC include one of a current, a voltage, a temperature or some combination thereof, at one or more consecutive time instants.

3. The method of claim 1, wherein the mean of the current SoC of the battery is determined using a feedback of at least one previously determined means of the SoC.

4. The method of claim 1, wherein the sensors are measurement devices such as sensing devices coupled to an electronic circuit structure, attached to a battery supply.

5. The method of claim 1, wherein determining the first joint Gaussian distribution includes:
    determining a distribution, of the SoC of the battery, and determining a probability distribution for estimating the SoC on the basis of the distribution of the SoC corresponding to current measured physical quantities of the battery as a combination of the distribution of the SoC corresponding to the set of historical measured physical quantities of the battery, wherein the set of historical measured physical quantities include at least two historical measured data points, by:
    identifying a statistical distance between each current measured data point of the current measured data points and the corresponding at least two historical measured data points of the set of historical measured data points, and
    processing, a weighted valve in this combination on basis of an amount of the identified statistical distance of the current measured physical quantity data point is to each of the at least two historical measured data points, wherein if a historical measured data point has a lesser statistical distance to a current measured physical quantity data point, then the SoC corresponding to that historical measured data point is in the combination and processed having a weight larger than the other historical measured data point having a greater statistical distance to the current measured physical quantity data point.

6. The method of claim 3, further comprising:
    filtering a sequence of determined means of the values of the SoC estimates over a period of time.

7. The method of claim 1, wherein the memory includes stored data relating to the set of historical measured physical quantities of the state of the battery and the corresponding set of historical values of the SoC of the battery from a given set of historical measured physical quantities and other information relating to estimating the SoC of the battery.

8. The method of claim 1, further comprising using a sparse learning module for at least one step in estimating the SoC of a battery to reduce an amount of the historical data.

9. The method of claim 1, wherein the current measured physical quantities of the battery include one or combination of a voltage, a current, a temperature, an ambient temperature, a volume and a gas leak measurement from the battery.

10. The method of claim 9, wherein the current measured physical quantities includes current measurements in the current.

11. The method of claim 1, wherein the set of historical measured physical quantities of the state of the battery further includes aging of the battery data, leakage of current over time data of the battery data, error rate of the current measured physical quantities of the state of the battery data and other related error related data.

12. A method for estimating a state of charge (SoC) of a rechargeable battery while the battery is in communication with at least one processor connected to a memory, the at least one processor receiving, via a transceiver, current measured physical quantities of the battery from sensors operatively connected to the battery, the method comprising:
    using the at least one processor for
        selecting a first joint Gaussian distribution determined based upon, a set of historical measured physical quantities of the state of the battery and a corresponding set of historical values of the SoC of the battery, stored in the memory;

determining a second joint Gaussian distribution of values of the SoC of the battery using the set of historical measured physical quantities of the state of the battery, the corresponding set of historical values of the SoC of the battery, the current measured physical quantities of the battery, and the determined first joint Gaussian distribution; and determining, a mean and a variance of a current SoC of the battery from the second joint Gaussian distribution, wherein the mean is an estimate of the current SoC of the battery, and the variance is a confidence of the estimate, wherein the method assists in improving a battery life by protecting the battery from over-discharge and over-charge events.

13. The method of claim 12, wherein the set of historical measured physical quantities of the state of the battery and measured values from determining the current estimate of the SoC include one of a current, a voltage, a temperature, at one or more consecutive time instants or some combination thereof.

14. The method of claim 12, further comprising:

storing in the memory training data including the set of historical measured physical quantities of the state of the battery and the corresponding set of historical values of the SoC of the battery; and detecting, current measurements of physical quantities of the state of the battery using sensing devices coupled to an electronic circuit structure.

15. The method of claim 12, wherein the set of historical measured physical quantities of the state of the battery further includes aging of the battery data, leakage of current over time data of the battery data, error rate of the current measured physical quantities of the state of the battery data and other related error related data.

16. The method of claim 12, further comprising, filtering a sequence of determined means of the values of the SoC estimates over a period of time; and employing a feedback of at least one previously determined SoC estimates is used in the estimation stage for determining a current SoC estimate of the battery.

17. The method of claim 12, wherein determining the first joint Gaussian distribution includes determining a distribution, of the SoC of the battery, and determining a probability distribution for estimating the SoC on the basis of the distribution of the SoC corresponding to current measured physical quantities of the battery as a combination of the distribution of the SoC corresponding to the set of historical measured physical quantities of the battery, wherein the set of historical measured physical quantities include at least two historical measured data points, by:

identifying a statistical distance between each current measured data point of the current measured data points and the corresponding at least two historical measured data points of the set of historical measured data points, and processing, a weighted valve in this combination on basis of an amount of the identified statistical distance of the current measured physical quantity data point is to each of the at least two historical measured data points, wherein if a historical measured data point has a lesser statistical distance to a current measured physical quantity data point, then the SoC corresponding to that historical measured data point is in the combination and processed having a weight larger than the other historical measured data point having a greater statistical distance to the current measured physical quantity data point.

18. A sensor system for estimating a state of charge (SoC) of a battery, the sensor system having a processor operatively connected to a memory, the memory having stored data that includes data estimating the SoC of the battery, wherein the processor receives, via a transceiver, current measured physical quantities of the battery from sensors operatively connected to the battery, the system comprising:

select from the memory, via the processor, a first joint Gaussian distribution of values of the SoC of the battery given a set of historical measured physical quantities of a state of the battery and the corresponding set of historical values of the SoC of the battery;

determine, via the processor, a second joint Gaussian distribution of SoC of the battery using the set of historical measured physical quantities of the state of the battery and the corresponding set of historical values of the SoC of the battery, the current measured physical quantities of the battery, and the first joint Gaussian distribution; and determine, via the processor, a mean and a variance of the current value of the SoC of the battery from the second joint Gaussian distribution, wherein the mean is an estimate of the current SoC of the battery, and the variance is a confidence of the estimate, wherein the system assists in improving a battery life by protecting the battery from over-discharge and over-charge events.

19. The sensor system of claim 18, wherein the processor is further configure for:

storing data related to predicting the SoC of the battery that includes training data consisting of the set of historical measured physical quantities of the state of the battery and the corresponding set of historical values of the SoC of the battery and other information related to estimating the SoC of the battery;

selecting the first joint Gaussian distribution, in part, by the set of historical measured physical quantities of the state of the battery and the corresponding set of historical values of the SoC of the battery using at least one previously stored selection distribution procedure on the processor; and determining the second joint Gaussian distribution includes, in part, evaluating, the set of historical measured physical quantities of the state of the battery, the corresponding set of historical values of the SoC of the battery, the current measured physical quantities of the battery and the determined first joint Gaussian distribution.

20. The sensor system of claim 18, wherein the sensor system includes one of an inertial measurement unit, at least one display operatively coupled to other components through connections, or some combination thereof.

\* \* \* \* \*